US006707403B1

(12) United States Patent
Hurrell

(10) Patent No.: US 6,707,403 B1
(45) Date of Patent: Mar. 16, 2004

(54) ANALOG TO DIGITAL CONVERTER WITH A CALIBRATION CIRCUIT FOR COMPENSATING FOR COUPLING CAPACITOR ERRORS, AND A METHOD FOR CALIBRATING THE ANALOG TO DIGITAL CONVERTER

(75) Inventor: Christopher Peter Hurrell, Cookham (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/292,116

(22) Filed: Nov. 12, 2002

(51) Int. Cl.$^7$ ................................................. H03M 1/10
(52) U.S. Cl. ........................ 341/120; 341/155; 341/172
(58) Field of Search ............................... 341/155, 144, 341/172, 120, 163

(56) References Cited

U.S. PATENT DOCUMENTS

| 4,399,426 A | * | 8/1983  | Tan ............................ 341/120 |
| 4,799,042 A | * | 1/1989  | Confalonieri et al. ....... 341/118 |
| 5,235,335 A |   | 8/1993  | Hester et al. ................ 341/172 |
| 5,434,569 A |   | 7/1995  | Yung et al. .................. 341/172 |
| 5,581,252 A | * | 12/1996 | Thomas ....................... 341/144 |
| 5,767,801 A | * | 6/1998  | Okamoto ..................... 341/145 |
| 6,538,594 B1 | * | 3/2003  | Somayajula ................. 341/172 |

* cited by examiner

*Primary Examiner*—Peguy JeanPierre
(74) *Attorney, Agent, or Firm*—Wolf, Greenfield & Sacks, P.C.

(57) ABSTRACT

An ADC (1) of balanced architecture for determining a digital word corresponding to a sampled voltage of an input signal from an input line (33) comprises a first capacitor circuit (2) comprising a most significant capacitor array (4) and a least significant capacitor array (5) which are capacitively coupled by a coupling capacitor $C_{c1}$. A second capacitor circuit (29) coupled to ground balances the first capacitor circuit (2). A differential comparator 27 compares the voltage on the first capacitor circuit (2) with that on the second capacitor circuit (29). A SAR (42) responsive to the output of the differential comparator (27) outputs switch bits to a main switch network (32) for selectively switching the capacitors of the first capacitor circuit (2) to respective high and low voltage reference lines (34) and (35) until the voltage on first and second inputs (26) and (28) of the differential comparator (27) are equal for determining the digital word corresponding to the sampled voltage on the input line (33). A first calibration circuit (49) for calibrating the coupling capacitor ($C_{c1}$) for compensating for under or over capacitance of the coupling capacitor $C_{c1}$ comprises a plurality of binary weighted first calibrating capacitors (51) to (56) which are coupled by a calibration coupling capacitor $C_4$ to the least significant capacitor array (5). A first calibration switch network (57) is provided for selectively coupling the first calibrating capacitors (51) to (56) to either the second input (28) of the differential comparator (27), the first input (26) of the differential comparator (27), or ground. By coupling appropriate ones of the first calibrating capacitors (51) to (56) to the second input (28) of the differential comparator (27) over capacitance of the coupling capacitor ($C_{c1}$) is compensated for, and under capacitance is compensated for by coupling appropriate ones of the first calibrating capacitors (51) to (56) to the first input (26) of the differential comparator (27).

45 Claims, 11 Drawing Sheets

ANALOG TO DIGITAL CONVERTER WITH A CALIBRATION CIRCUIT FOR COMPENSATING FOR COUPLING CAPACITOR ERRORS, AND A METHOD FOR CALIBRATING THE ANALOG TO DIGITAL CONVERTER

FIELD OF THE INVENTION

The present invention relates to an analog to digital converter (ADC), and in particular, though not limited to a switched capacitor ADC, which comprises a calibration circuit for compensating for coupling capacitor errors in the ADC, and the invention also relates to a method for calibrating the ADC.

BACKGROUND OF THE INVENTION

Switched capacitor ADCs for converting a sampled analog voltage of an input signal to a digital output word are known. Such ADCs comprise a capacitor array, which comprises a plurality of binary weighted capacitors which are selectively chargeable through a switch network under the control of switch bits outputted by a successive approximation register (SAR) in response to the output of a comparator which compares the voltage of the capacitor array with a reference voltage. The switch bits outputted by the SAR progressively switch in and out capacitors of the capacitor array until the voltage on the capacitor array is equal to the reference voltage. The digital word formed by the switch bits outputted by the SAR when the respective voltages on the comparator are equal to each other, within the resolution of the ADC, is determined as being the digital word corresponding to the sampled voltage.

In a single stage binary weighted capacitor array the capacitor corresponding to the least significant bit (LSB) is of unit value, namely, $2^0$ unit of capacitance. The capacitor corresponding to the next LSB is of capacitance $2^1$ units of capacitance, and so on up to the capacitor corresponding to the most significant bit (MSB), which in an n bit ADC is of $2^{n-1}$ units of capacitance. Typically, each capacitor of the capacitor array is provided by the appropriate number of unit capacitors, each of $2^0$ unit capacitance, for example, the capacitor corresponding to the LSB comprises one capacitor of $2^0$ unit capacitance, and the capacitor corresponding to the MSB comprises $2^{(n-1)}$ capacitors, each of $2^0$ unit capacitance. Accordingly, ADCs with high resolution, for example, resolutions beyond eight bits, require an impracticably large number of unit capacitors. This leads to two problems. Firstly, the total capacitance of the array becomes so large that the voltages of the analog input signal and the reference voltage source are unable to drive the array at a reasonable speed, and secondly, the area of silicon on an integrated circuit (IC) chip required for the capacitors becomes uneconomically large. A reduction in the unit capacitor size, which to some extent would assist in overcoming these problems, in general, leads to the ratio accuracy of the ADC being compromised. To overcome these problems and to facilitate the provision of higher resolution ADCs, series-coupled array ADCs are provided.

In a series-coupled array, the capacitor array is divided into at least two capacitor arrays which are capacitively coupled. One of the capacitor arrays is a most significant array and comprises a capacitor array which represents the MSBs, and the second capacitor array is a least significant array comprising an array of capacitors which represent the LSBs. More than two capacitor arrays may be provided, and each capacitor array is capacitively coupled to the next more significant capacitor array. The value of each coupling capacitor which couples one capacitor array to the next more significant capacitor array depends on the parasitic capacitance in the lesser significant of the two capacitor arrays. Such parasitic capacitance is associated with each portion of the capacitor array, and the ideal value of the coupling capacitor $C_c$ in a two array ADC is:

$$C_c = C_1\left(\frac{C_2(2^L - 1) + C_{s2}}{C_2 2^L - C_1}\right)$$

where $C_1$ is the unit capacitance in the most significant capacitor array $C_2$ is the unit capacitance in the least significant capacitor array $C_{s2}$ is the parasitic capacitance associated with the least significant capacitor array and L is the number of capacitors in the least significant capacitor array.

Accordingly, it can be seen from the above equation that the capacitive value of the coupling capacitor for coupling a capacitor array with the next more significant capacitor array is dependent on the parasitic capacitance of the less significant capacitor array. When selecting the capacitance of the coupling capacitor, the capacitance is selected in order to compensate for the parasitic capacitance in the less significant capacitor array of the two capacitor arrays which are coupled by the coupling capacitor. However, due to processing variations in the fabrication of an ADC on silicon in an IC chip, the parasitic capacitance, and indeed the capacitance of the coupling capacitor can vary from chip to chip. Thus, there is a need for a calibration circuit for facilitating adjustment of the effective capacitance of the coupling capacitor between a less significant capacitor array and its next more significant capacitor array, for compensating for silicon and processing variations.

U.S. Pat. No. 5,434,569 of Yung, et al provides such a calibration circuit. Yung discloses a switched capacitor ADC which comprises a two array series-coupled capacitor circuit comprising a most significant capacitor array and a least significant capacitor array. The respective capacitor arrays are capacitively coupled by a coupling capacitor. The calibration circuit comprises an array of binary weighted calibration capacitors which are capacitively coupled to the least significant capacitor array through a small capacitor. A switch network is provided for selectively and alternately switching the calibration capacitors to the most significant capacitor array or to a reference voltage. By switching selected ones of the calibration capacitors to the most significant capacitor array the total capacitance value of the capacitive coupling between the least significant capacitor array and the most significant capacitor array can be increased to a value to compensate for under capacitance of the coupling capacitor, and in turn to compensate for the parasitic capacitance in the least significant capacitor array.

While the provision of the calibration circuit in the ADC of Yung is adequate for compensating for under capacitance of the coupling capacitor, it is unsuitable for correcting for over capacitance of a coupling capacitor.

There is therefore a need for an ADC which comprises a calibration circuit which overcomes the problems of prior art calibration circuits.

The present invention is directed towards providing such an ADC, and the invention is also directed towards providing a method for calibrating an ADC.

SUMMARY OF THE INVENTION

According to the invention there is provided an analog to digital converter (ADC) comprising:

a first capacitor circuit from which a digital output word is derived corresponding to a sampled analog voltage from an input signal, the first capacitor circuit comprising at least two capacitor arrays of progressively increasing significance, each capacitor array being capacitively coupled to the next more significant capacitor array, a second capacitor circuit, a comparator having a first input coupled to the most significant capacitor array, and a second input coupled to the second capacitor circuit, and a first calibration circuit comprising an array of first calibrating capacitors, coupled to one of the capacitor arrays of the first capacitor circuit which is less significant than the most significant capacitor array, the first calibrating capacitors being selectively coupleable to the second input of the comparator for compensating for capacitance errors in the capacitive coupling between the capacitor array to which the first calibration circuit is coupled and the next more significant capacitor array.

In one embodiment of the invention the first calibrating capacitors of the first calibration circuit are selectively coupleable to the first input of the comparator for compensating for capacitance errors in the capacitive coupling between the capacitor array to which the first calibration circuit is coupled and the next more significant array.

In another embodiment of the invention the first calibrating capacitors of the first calibration circuit are selectively coupleable to a first voltage reference.

Preferably, each of the first calibrating capacitors of the first calibration circuit are selectively coupleable to one of the second input of the comparator, the first input of the comparator, and the first voltage reference.

In one embodiment of the invention the first calibration circuit is coupled to the second most significant capacitor array of the first capacitor circuit.

In another embodiment of the invention the capacitor array of the first capacitor circuit to which the first calibration circuit is coupled is less significant than the second most significant capacitor array.

Preferably, a first calibrating switch network is provided between the first calibrating capacitors of the first calibration circuit and the second input of the comparator for selectively coupling the first calibrating capacitors to the second input of the comparator.

Advantageously, the first calibrating switch network is provided for selectively coupling the first calibrating capacitors of the first calibration circuit to the first input of the comparator. Preferably, the first calibrating switch network is provided for selectively coupling the first calibrating capacitors of the first calibration circuit to the first voltage reference.

In one embodiment of the invention the first calibrating capacitors of the first calibration circuit are coupled through a first common node to the capacitor array of the first capacitor circuit. Preferably, the first common node to which first calibrating capacitors of the first calibration circuit are coupled is capacitively coupled to the capacitor array of the first calibration capacitor circuit by a first coupling capacitor for attenuating the capacitance value effect of the first calibrating capacitors.

In one embodiment of the invention the first common node to which the first calibrating capacitors are coupled is coupled to a voltage reference by a first co-operating attenuating capacitor for co-operating with the first calibration coupling capacitor for attenuating the capacitance value effect of the first calibrating capacitors.

In another embodiment of the invention the first calibrating capacitors of the first calibration circuit are binary weighted relative to each other.

In another embodiment of the invention the capacitors of the capacitor arrays of the first capacitor circuit are selectively switchable for determining the digital word corresponding to the sampled voltage of the input signal.

Preferably, the second capacitor circuit capacitively couples the second input of the comparator to a main voltage reference.

In a further embodiment of the invention the second capacitor circuit comprises respective capacitor arrays corresponding to the capacitor arrays in the first capacitor circuit, each capacitor array of the second capacitor circuit being capacitively coupled to the next more significant capacitor array, and the most significant capacitor array of the second capacitor circuit being coupled to the second input of the comparator.

Preferably, the capacitor arrays of the second capacitor circuit are coupled to the main voltage reference.

In another embodiment of the invention the ADC is adapted for receiving a differential signal, the capacitors of the capacitor arrays of the respective first and second capacitor circuits being selectively switchable for determining a digital word corresponding to a sampled differential voltage of the differential signal.

In one embodiment of the invention the first calibration circuit compensates for capacitance errors in the capacitive coupling in the second capacitor circuit between the two capacitor arrays in the second capacitor circuit, the less significant of which corresponds to the less significant capacitor array of the first capacitor circuit to which the first calibration circuit is coupled.

In one embodiment of the invention a second calibration circuit is provided comprising an array of second calibrating capacitors coupled to one of the capacitor arrays of the second capacitor circuit which is less significant than the most significant capacitor array of the second capacitor circuit, the second calibrating capacitors being selectively coupleable to the first input of the comparator.

In one embodiment of the invention the second calibrating capacitors of the second calibration circuit are selectively coupleable to the first input of the comparator.

In another embodiment of the invention the second calibrating capacitors of the second calibration circuit are selectively coupleable to a second voltage reference.

Preferably, the second calibrating capacitors of the second calibration circuit are selectively coupleable to one of the first input of the comparator, the second input of the comparator, and the second voltage reference.

In one embodiment of the invention the second calibration circuit is coupled to the second most significant capacitor array of the second capacitor circuit.

In a further embodiment of the invention the capacitor array of the second capacitor circuit to which the second calibration circuit is coupled is less significant than the second most significant capacitor array.

Preferably, a second calibrating switch network is provided between the second calibrating capacitors of the second calibration circuit and the first input of the comparator for selectively coupling the second calibrating capacitors of the second calibration circuit to the first input of the comparator. Advantageously, the second calibrating switch network is provided for selectively coupling the second calibrating capacitors of the second calibration circuit to the second input of the comparator.

Advantageously, the second calibrating switch network is provided for selectively coupling the second calibrating capacitors of the second calibration circuit to the second voltage reference.

In one embodiment of the invention the second calibrating capacitors of the second calibration circuit are coupled through a second common node to the capacitor array of the second capacitor circuit. Preferably, the second common node to which the array of second calibrating capacitors of the second calibration circuit is coupled is capacitively coupled to the capacitor array of the second capacitor circuit by a second calibration coupling capacitor for attenuating the capacitive value of the second calibrating capacitors.

In one embodiment of the invention the second common node to which the second calibrating capacitors are coupled is coupled to a voltage reference by a second co-operating attenuating capacitor for co-operating with the second calibration coupling capacitor for attenuating the capacitance value effect of the second calibrating capacitors.

In another embodiment of the invention the second calibrating capacitors of the second calibration circuit are binary weighted relative to each other.

In another embodiment of the invention a first main switch network is provided for selectively and alternately switching the capacitors of the capacitor arrays of the first capacitor circuit to an upper voltage reference and a lower voltage reference for charging thereof.

In a further embodiment of the invention the first main switch network is provided for selectively switching the capacitors of the capacitor arrays of the first capacitor circuit to the input signal, the voltage of which is to be sampled.

In another embodiment of the invention a first charge control switch is coupled to the first input of the comparator for selectively coupling the first input of the comparator to the main voltage reference during sampling of the voltage of the input signal.

In a further embodiment of the invention a second charge control switch is coupled to the second input of the comparator for selectively coupling the second input of the comparator to the main voltage reference during sampling of the voltage of the input signal.

In a still further embodiment of the invention a second main switch network is provided for selectively and alternately switching the capacitors of the capacitor arrays of the second capacitor circuit to the upper voltage reference and the lower voltage reference for configuring the ADC as a differential ADC.

In one embodiment of the invention the second main switch network is provided for selectively switching the capacitors of the capacitor arrays of the second capacitor circuit to one end of a differential input signal, the voltage of which is to be sampled, the capacitors of the capacitor arrays of the first capacitor circuit being selectively switched to the other end of the differential input signal by the first main switch network.

In an alternative embodiment of the invention a first input charge capacitor is connected to the first input of the comparator, and the first input charge capacitor is selectively switchable to the input signal, the voltage of which is to be sampled for charging the first input charge capacitor, and the main voltage reference when the first input charge capacitor has been charged.

In a further alternative embodiment of the invention a second input charge capacitor is connected to the second input of the comparator, and the second input charge capacitor is selectively switchable to one end of a differential input signal, the voltage of which is to be sampled for charging the second input charge capacitor, and the first input charge capacitor when the first and second input charge capacitors have been charged, the first input charge capacitor being selectively switchable to the other end of the differential input signal.

Additionally, the invention provides an analog to digital converter (ADC) comprising:
a first capacitor circuit from which a digital output word is derived corresponding to a sampled analog voltage from an input signal, the first capacitor circuit comprising at least three capacitor arrays of progressively increasing significance, each capacitor array being capacitively coupled to the next more significant capacitor array,
a comparator having a first input coupled to the most significant capacitor array, and a second input coupled to a voltage reference, and
a first calibration circuit comprising an array of first calibrating capacitors, coupled to one of the capacitor arrays of the first capacitor circuit which is less significant than the second most significant capacitor array, the first calibrating capacitors being selectively coupleable to the first input of the comparator for compensating for capacitance errors in the capacitive coupling between the capacitor array to which the first calibration circuit is coupled and the next more significant capacitor array.

In one embodiment of the invention the first calibrating capacitors of the first calibration circuit are selectively coupleable to a voltage reference which may be the same or different to the voltage reference to which the second input of the comparator is coupled.

The invention also provides a method for compensating for capacitance errors in capacitive coupling in an ADC of the type comprising a first capacitor circuit from which a digital output word is derived corresponding to a sampled analog voltage from an input signal, the first capacitor circuit comprising at least two capacitor arrays of progressively increasing significance, each capacitor array being capacitively coupled to the next more significant capacitor array, and a comparator having a first input coupled to the most significant capacitor array and a second input coupled to a second capacitor circuit, the method comprising the steps of coupling a first calibration circuit comprising an array of first calibrating capacitors to one of the capacitor arrays of the first capacitor circuit which is less significant than the most significant capacitor array, and selectively coupling the first calibrating capacitors to the second input of the comparator for compensating for the capacitance errors in the capacitive coupling between the capacitor array to which the first calibration circuit is connected and the next more significant capacitor array until the capacitance errors in the capacitive coupling have been compensated for.

In one embodiment of the invention the first calibrating capacitors of the first calibration circuit which are not coupled to the second input of the comparator are coupled to a first voltage reference.

In another embodiment of the invention the first calibrating capacitors are selectively coupled to one of the second input of the comparator and the first input of the comparator for compensating for capacitance errors in the capacitive coupling between the capacitor array to which the first calibration circuit is coupled and the next more significant capacitor array until the capacitance errors in the capacitive coupling have been compensated for, and the first calibrating capacitors which are not coupled to one of the first input and the second input of the comparator are coupled to the first voltage reference.

ADVANTAGES OF THE INVENTION

The advantages of the invention are many. The ADC according to the invention can be readily easily calibrated with a relatively high degree of accuracy. The provision of the first calibration circuit permits accurate compensation for any errors in the value of the capacitive coupling between the capacitor array to which the first calibration circuit is coupled and the next more significant capacitor array, and where the capacitive coupling also takes into account the effect of parasitic or unswitched capacitance in the less significant capacitor array, the parasitic capacitance is also compensated for. When the first calibration circuit is provided with the first calibrating capacitors selectively switchable to the second input of the comparator, over capacitance of the capacitive coupling between the capacitor array to which the first calibration circuit is coupled and the next more significant capacitor array is compensated for. When the first calibrating capacitors of the first calibration circuit are selectively switchable to the first input of the comparator, under capacitance in the capacitive coupling is compensated for. However, a particularly important advantage of the invention is achieved when the first calibrating capacitors of the first calibration circuit are selectively coupleable to one or other of the first and second inputs of the comparator, since both under and over capacitance in the capacitive coupling is compensated for. In other words, bi-directional compensation for capacitance errors in the capacitive coupling is provided for.

Additionally, by providing the first calibrating capacitors to be selectively switchable to one or other of the first and second inputs of the comparator, and also to the first voltage reference has the particularly important advantage that it effectively doubles the calibration range, while maintaining the calibration resolution. By providing the first calibration circuit with the first calibrating capacitors selectively switchable to the second input of the comparator and the first reference voltage permits those of the first calibrating capacitors not to required for calibration to be switched to the first reference voltage.

A further and particularly important advantage of the invention is achieved when the first calibrating capacitors of the first calibration circuit are selectively switchable to one or other of the first and second inputs of the comparator, thereby facilitating compensating for both under and over capacitance of the coupling capacitor between the capacitor array to which the first calibration circuit is coupled and the next more significant capacitor array. When the unit capacitance value of the capacitors of the two arrays are equal, the coupling capacitor can also be made equal to the unit capacitance value of the capacitors of the two capacitor arrays. Since a unit size coupling capacitor provides better matching to the rest of the capacitor arrays, a smaller calibration range is required from the first calibration circuit.

The provision of the first calibration circuit and its arrangement in the ADC is particularly suitable for both single ended and differential switched capacitor ADCs of balanced architecture, although the first calibration circuit and its arrangement in the ADC according to the invention is also suitable for single ended switched capacitor ADCs of non-balanced architecture, where the two inputs of the comparator are not capacitively balanced. Furthermore, the ADC may be provided as a single ended switched capacitor circuit of non-balanced architecture of the type where the first input of the comparator is coupled to the most significant capacitor array, and the second input of the comparator is coupled directly to a reference voltage, for example, to ground. In the case of such a single ended non-balanced switched capacitor ADC, the first calibration circuit is arranged so that the first calibrating capacitors are selectively switchable to the first input of the comparator, and preferably, the first calibration circuit is arranged so that the first calibrating capacitors are selectively switchable to one or other of the first input of the comparator and the first voltage reference. In this case the calibration circuit is particularly suitable for calibrating capacitive coupling between the second most significant capacitor array and its next less significant capacitor array.

The ADC according to the invention with the first calibration circuit is also ideally suited for adaptation as a differential ADC, and when provided as a differential switched capacitor ADC, a single first calibration circuit is sufficient for compensating for capacitive coupling in both the first and second capacitor circuits. However, where a second calibration circuit is provided coupled to a capacitor array of the second capacitor circuit, as well as a first calibration circuit coupled to a corresponding capacitor array of the first calibration circuit, the calibration range is increased and the first and second inputs to the comparator are better balanced for increasing rejection of noise interference from other parts of the ADC circuitry. The advantages obtained by providing the various switching arrangements for switching the second calibrating capacitors to one or other of the first input to the comparator and the first voltage reference on the one hand, and to one or other of the second input of the comparator and the first voltage reference on the other hand are similar to those already described with reference to the first calibration circuit. The advantage of providing the second calibrating capacitors to be selectively switchable to one of either the first and second inputs of the comparator and the first voltage reference are also similar to those described with reference to the first calibration circuit.

A further advantage of the invention is achieved by virtue of the fact that the calibration switches of the calibration network in each calibration circuit are located so that they are between the calibrating capacitors and the one of the first and second inputs of the comparator and ground, and thus the switches of the calibration network are never coupled to a capacitor array which is less significant than the most significant capacitor array. The advantage of this is that the inherent capacitance of the switches of the calibration switch network has little or no effect on the most significant capacitor array, in other words, the inherent capacitance of the switches of the calibration switch network cause little or no matching errors in the most significant capacitor array, due to the fact that the voltage on the first or second input to the comparator is substantially the same at the end of a conversion as it is directly after the input signal has been sampled. Whereas if the switches of the calibration switch network were to have been connected to a capacitor array of less significance than the most significant capacitor array, the inherent capacitance of the switches coupled to the less significant capacitor array would cause unwanted matching errors. This is a particularly important advantage which is achieved by the present invention which overcomes one of the problems of the ADC of Yung in U.S. Pat. No. 5,434,569, since if Yung were to use his calibration circuit for compensating for capacitance errors in a coupling capacitor coupling to capacitor arrays wherein the more significant capacitor array was the second most significant capacitor array or a lesser significant capacitor array, the switches of the switch network of Yung would have to be coupled to one or other of the capacitor arrays which would be less significant than the most significant capacitor array.

These and other advantages of the invention will be readily apparent to those skilled in the art from the following description of some preferred embodiments thereof, which

DETAILED DESCRIPTION OF THE PREFERRED EMBODIMENTS

Figure 1:
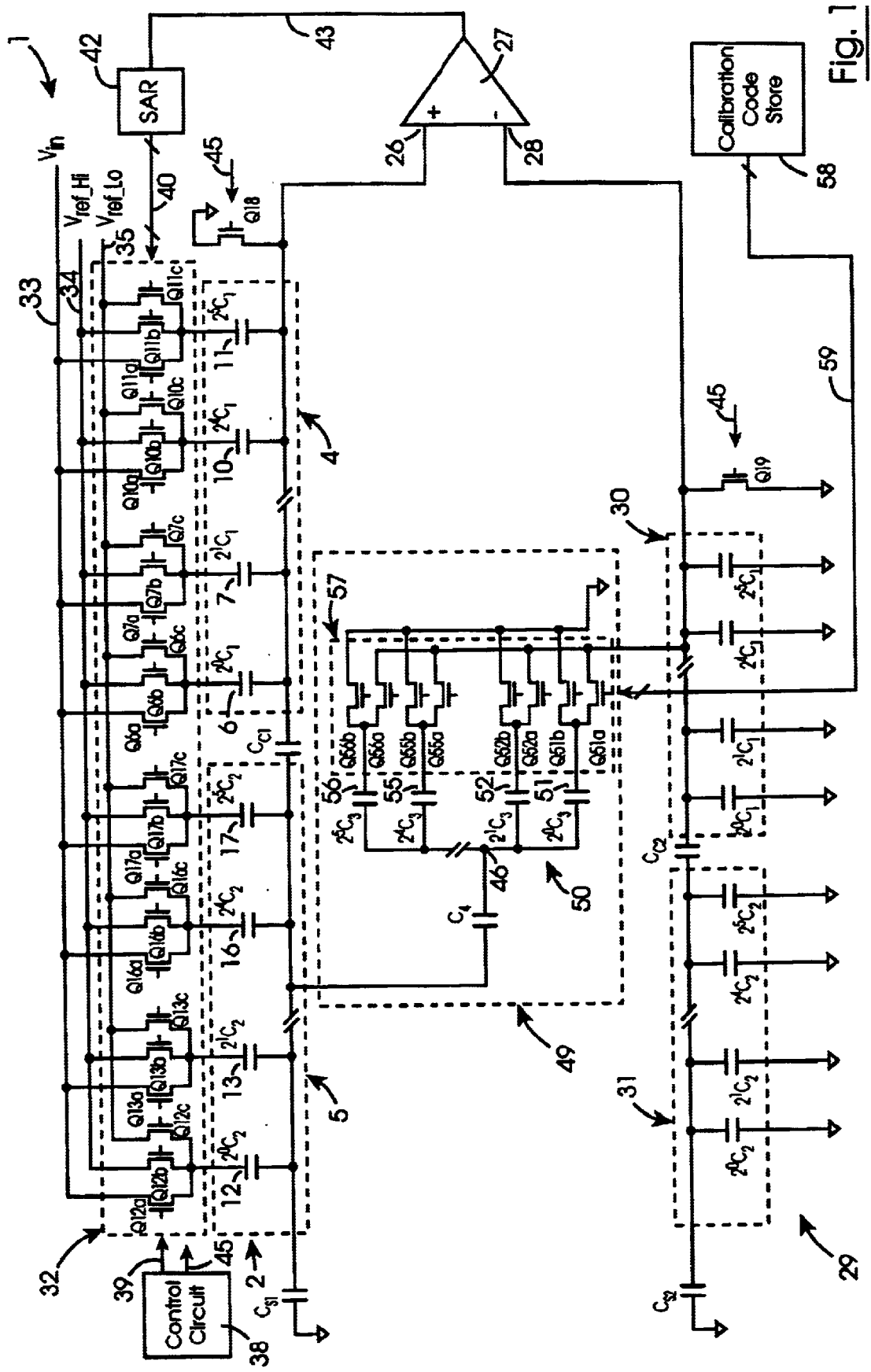
FIG. 1 is a circuit diagram of an ADC according to one embodiment of the invention.

Referring now to the drawings and initially to FIG. 1, there is illustrated a twelve bit successive approximation switched capacitor ADC according to the invention, indicated generally by the reference numeral 1, of single ended balanced architecture, which is implemented in an IC. The ADC 1 comprises a first capacitor circuit 2 which comprises two series-coupled capacitor arrays, namely, a most significant capacitor array 4 and a least significant capacitor array 5.

The most significant capacitor array 4 comprises six binary weighted capacitors corresponding to the six most significant bits (MSBs). Four of the capacitors of the most significant capacitor array 4 are illustrated, namely, the least significant capacitor 6, the second least significant capacitor 7, and the second most significant capacitor 10 and the most significant capacitor 11. The third least significant capacitor, which would be the capacitor 8 is not illustrated, nor is the third most significant capacitor, which would be the capacitor 9. The least significant capacitor 6 of the most significant capacitor array 4 is of capacitance $2^0 C_1$ unit of capacitance The capacitance of the second least significant capacitor 7 is $2^1 C_1$ units of capacitance and so on to the most significant capacitor 11 which is of capacitance of $2^5 C_1$ units of capacitance.

The least significant capacitor array 5 comprises six binary weighted capacitors corresponding to the six least significant bits (LSBs). Four of the capacitors of the least significant capacitor array 5 are shown, namely, the least significant capacitor 12, the second least significant capacitor 13, the second most significant capacitor 16 and the most significant capacitor 17. The third least significant capacitor, which would be the capacitor 14 is not illustrated, nor is the third most significant capacitor, which would be the capacitor 15. The capacitance of the least significant capacitor 12 of the least significant capacitor array 5 is $2^0 C_2$ unit of capacitance, while the capacitance of the second least significant capacitor 13 is $2^1 C_2$ units of capacitance, and so on up to the most significant capacitor 17 of the least significant capacitor array 5 which is of capacitance $2^5 C_2$ units of capacitance.

Typically, the six capacitors of each of the most and least significant capacitor arrays 4 and 5 are implemented by the appropriate number of unit capacitors $C_1$ and $C_2$, respectively. For example, the least significant capacitor 12 of the least significant capacitor array 5 is implemented by one capacitor of $2^0 C_2$ unit of capacitance while the most significant capacitor 17 of the least significant capacitor array 5 is implemented by $2^5$ capacitors each of $2^0 C_2$ unit of capacitance. Similarly, in the case of the most significant capacitor array 4, the least significant capacitor 6 is implemented by one capacitor of $2^0 C_1$ unit of capacitance, while the most significant capacitor 11 of the most significant capacitor array 4 is implemented by $2^5$ capacitors, each of capacitance of $2^0 C_1$ unit of capacitance.

The least significant capacitor array 5 is capacitively coupled to the most significant capacitor array 4 by a coupling capacitor $C_{c1}$. The ideal value of the coupling capacitor $C_{c1}$ as described above is:

$$C_{c1} = C_1 \left( \frac{C_2(2^6 - 1) + C_{s1}}{C_2 2^6 - C_1} \right)$$

where $C_1$ is the unit value of capacitance of the least significant capacitor 6 of the most significant capacitor array 4, $C_2$ is the unit value of capacitance of the least significant capacitor 12 of the least significant capacitor array 5, and $C_{s1}$ is the parasitic capacitance plus any unswitched capacitance of the least significant capacitor array 5.

In this embodiment of the invention the unit value of capacitance of the capacitors $C_1$ and $C_2$ of the most significant and least significant capacitor arrays 4 and 5, respectively, are similar. Thus, in theory the value of the coupling capacitor $C_{c1}$ can be chosen to be of capacitance equal to the unit value of capacitance of the capacitors $C_1$ and $C_2$ of the most significant and least significant capacitor arrays 4 and 5, respectively.

The most significant capacitor array 4 is connected to a first input 26, namely, a positive input of a differential comparator 27. A second input 28, namely, a negative input of the differential comparator 27 is coupled to a main voltage reference, in this embodiment of the invention ground, through a second capacitor circuit 29 for balancing charge injection errors from first and second charge control switches Q18 and Q19 which are described in detail below. The second capacitor circuit 29 is identical to the first capacitor circuit 2 and comprises a most significant capacitor array 30 and a least significant capacitor array 31, which are capacitively coupled by a coupling capacitor $C_{c2}$. The most significant capacitor array 30 comprises six binary weighted capacitors of respective capacitance identical to those of the capacitors of the most significant capacitor array 4 of the first capacitor circuit 2, namely, $2^0 C_1$, $2^1 C_1$, $2^2 C_1$, $2^3 C_1$, $2^4 C_1$ and $2^5 C_1$. The least significant capacitor array 31 comprises six binary weighted capacitors of respective capacitance identical to those of the capacitors of the least significant capacitor array 5 of the first capacitor circuit 2, namely, $2^0 C_2$, $2^1 C_2$, $2^2 C_2$, $2^3 C_2$, $2^4 C_2$ and $2^5 C_2$. The coupling capacitor $C_{c2}$ is of capacitance similar to the capacitance of the coupling capacitor $C_{c1}$. The most significant capacitor array 30 is coupled to the second input 28 of the comparator 27, thus, providing the ADC 1 with a balanced architecture.

A first main switch network 32 selectively couples the capacitors of the most significant capacitor array 4 and of the least significant capacitor array 5 to an input line 33, and to two lines 34 and 35 during a conversion cycle. The analog input signal is applied to the input line 33, and when the capacitors of the most significant and least significant capacitor arrays 4 and 5 are coupled to the input line 33, the capacitors are charged to the input voltage on the input line 33 for sampling thereof. The line 34 is held at an upper reference voltage $V_{ref\_hi}$, and the line 35 is held at a lower reference voltage $V_{ref\_lo}$. The first main switch network 32 comprises a plurality of transistor switches Q6a, Q6b and Q6c to Q17a, Q17b and Q17c for selectively coupling the respective capacitors 6 to 17 to the lines 33, 34 and 35. Each capacitor 6 to 17 is selectively coupleable to the lines 33, 34 and 35 by three corresponding transistor switches of the transistor switches Q6a, Q6b and Q6c to Q17a, Q17b and Q17c. For example, the least significant capacitor 6 of the most significant capacitor array 4 is selectively coupleable by the transistor switches Q6a, Q6b and Q6c to the respective lines 33, 34 and 35, respectively, and so on to the most significant capacitor 11 of the most significant capacitor array 4 which is selectively coupleable to the lines 33, 34 and 35 by the transistor switches Q11a, Q11b and Q11c, respectively. Similarly, in the case of the least significant capacitor array 5, the least significant capacitor 12 is selectively coupleable to the lines 33, 34 and 35 by the transistor switches Q12a, Q12b and Q12c, respectively, while the most significant capacitor 17 of the least significant capacitor array 5 is selectively coupleable to the lines 33, 34 and 35 by the transistor switches Q17a, Q17b and Q17c, respectively.

The transistors Q6a to Q17a are operated simultaneously under the control of a control circuit 38 by a control signal on a control line 39 from the control circuit 38 for simultaneously coupling the capacitors 6 to 17 to the input line 33 for initial charging of the capacitors 6 to 17 for sampling the voltage on the input line 33 during a conversion cycle. The transistors Q6b to Q17b and the transistors Q6c to Q17c are alternately operable by switch bits outputted on a twelve bit bus 40 by a successive approximation register (SAR) 42 during the conversion cycle for determining the digital word corresponding to the sampled voltage. As will be well known to those skilled in the art, the SAR 42, in response to the output on a line 43 from the comparator 27, outputs switch bits to the respective transistor switches Q6b and Q6c to Q17b and Q17c for selectively switching the capacitors 6 to 17 to the respective upper and lower reference voltage lines 34 and 35 for driving the voltage on the first input 26 of the comparator 27 to equal the voltage on the second input 28, within the resolution of the ADC 1, at which stage, the switch bits outputted by the SAR 42 are determined to represent the digital word corresponding to the sampled voltage.

The first charge control switch Q18, namely, a transistor switch is operable under the control of the control circuit 38 by a signal on a control line 45 from the control circuit 38 for switching the first input 26 of the comparator 27 to the main voltage reference, namely, ground during charging of the capacitors 6 to 17 of the first capacitor circuit 2 by the voltage on the input line 33. The corresponding second charge control switch Q19 provided by a transistor switch of similar area to the first charge control switch Q18 is operable under the control of the control circuit 38 by the control signal on the control line 45 from the control circuit 38 for coupling the second input 28 of the comparator 27 to the main voltage reference, namely, ground during charging of the capacitors 6 to 17 by the voltage on the input line 33. The first and second charge control switches Q18 and Q19 are simultaneously operated by a control signal on the control line 45 from the control circuit 38 so that the effect of the parasitic capacitance of the first charge control switch Q18 on the first input 26 of the comparator 27 both when the first charge control switch Q18 is switched on and off is compensated for on the second input 28 of the comparator 27 by the corresponding parasitic capacitance of the second charge control switch Q19.

A first calibration circuit 49 is provided for calibrating the coupling capacitor $C_{c1}$ for, in this embodiment of the invention, compensating for over capacitance in the coupling capacitor $C_{c1}$. The first calibration circuit 49 comprises an array 50 of six binary weighted first calibrating capacitors 51 to 56, although the calibrating capacitors 53 and 54 are not illustrated. The first calibrating capacitors 51 to 56 are connected to a first common node 46, which is capacitively coupled to the least significant capacitor array 5 by a first calibration coupling capacitor $C_4$. A first calibration switch network 57 comprising transistor switches Q51a and Q51b to Q56a and Q56b is provided for selectively coupling the respective first calibrating capacitors 51 to 56 to the second input 28 of the comparator 27 or a first voltage reference, namely, ground, for compensating for the capacitive errors in the coupling capacitor $C_{c1}$, as will be described below. The transistor switches Q51a and Q51b to Q56a and Q56b are operable under the control of a calibration code which is stored in a non-volatile calibration code storing circuit 58, after calibration of the coupling capacitor $C_{c1}$ has been completed. The calibration code is applied on a twelve bit bus 59 to the transistor switches Q51a and Q51b to Q56a and Q56b for appropriately switching the first calibrating capacitors 51 to 56 to either the second input 28 of the comparator 27 or ground. The calibration code storing circuit 58 may be implemented by any suitable non-volatile storing circuit, for example, a fuse array or the like. The calibration code is permanently stored in the calibration code storing circuit 58 on completion of calibration of the ADC 1 during initial test and calibration. As described above, the first calibrating capacitors 51 to 56 are binary weighted. The least significant first calibrating capacitor 51 is of unit capacitance value of $2^0 C_3$ unit capacitance. The next significant first calibrating capacitor 52 is of capacitance of $2^{1C}{}_3$ units of capacitance, and so on up to the most significant first calibrating capacitor 56 which is of capacitance of $2^5 C_3$ units of capacitance. In practice, each of the first calibrating capacitors 51 to 56 will be provided by the appropriate number of capacitors each of $2^0 C_3$ unit of capacitance as already described with reference to the capacitors 6 to 11 of the most significant capacitor array 4 and the capacitors 12 to 17 of the least significant capacitor array 5 of the first capacitor circuit 2. The first calibration coupling capacitor $C_4$ attenuates the capacitive value of the first calibrating capacitors 51 to 56, thereby permitting the first calibrating capacitor to be of relatively large size, while still maintaining high resolution of calibration.

By successively and selectively switching the first calibrating capacitors 51 to 56 to the second input 28 of the comparator 27, the capacitive coupling between the least significant capacitor array 5 and the second input 28 of the comparator 27 is progressively increased. Since the second input 28 of the comparator 27 has the opposite polarity to that of the first input 26, which is connected to the most significant capacitor array 4, the effect is the same as progressively decreasing the capacitance of the coupling capacitor $C_{c1}$. Since in this embodiment of the invention the first calibration circuit 49 has the effect of progressively reducing the capacitance of the coupling capacitor $C_{c1}$ as the first calibrating capacitors 51 to 56 are successively switched to the second input 28 of the comparator 27, the coupling capacitor $C_{c1}$ should be selected to be of size so that an average coupling capacitor $C_{c1}$ would have a calibration value substantially midway within the calibration range of the first calibration circuit 49.

Initially the first calibrating capacitors 51 to 56 are switched to ground by the transistor switches Q51a and Q51b to Q56a and Q56b. During calibration the first calibrating capacitors 51 to 56 are selectively switched from ground to the second input 28 of the comparator 27 for progressively increasing the capacitance switched to the second input 28 until the capacitive errors in the coupling capacitor $C_{c1}$ have been corrected. Those first calibrating capacitors which are not required to be switched to the second input 28 of the comparator 27 during calibration are left switched to ground, thereby minimizing the effect of the first calibrating capacitors switched to ground on the ADC 1.

Calibration of the ADC 1 is carried out by applying a range of known input voltages to the input line 33 and operating the ADC 1 through a number of conversion cycles. If the digital words determined by the ADC 1 corresponding to the known input voltages are not ideal, then the first calibrating capacitors 51 to 56 are appropriately switched from ground by the first calibration switch network 57 to the second input 28 of the comparator 27 until the digital words determined by the ADC 1 most closely correspond to the known input voltages. The calibration code for switching the transistor switches Q51a and Q51b to Q56a and Q56b of the first calibration switch network 57 for appropriately coupling the first calibrating capacitors 51 to 56 to the second input 28 of the comparator 27 and ground as appropriate is then programmed into the calibration code storing circuit 58. Once the calibration code has been stored in the calibration code storing circuit 58, on power up of the ADC 1 the transistor switches of the first calibration switch network 57 are appropriately switched for connecting the appropriate ones of the first calibrating capacitors 51 to 56 to the second input 28 of the comparator 27 and the remaining first calibrating capacitors 51 to 56 to ground. Thereafter the ADC 1 operates in conventional fashion sampling the voltage on the input line 33 at the beginning of each conversion cycle, and determining the corresponding digital word corresponding to each sampled voltage.

Figure 2:
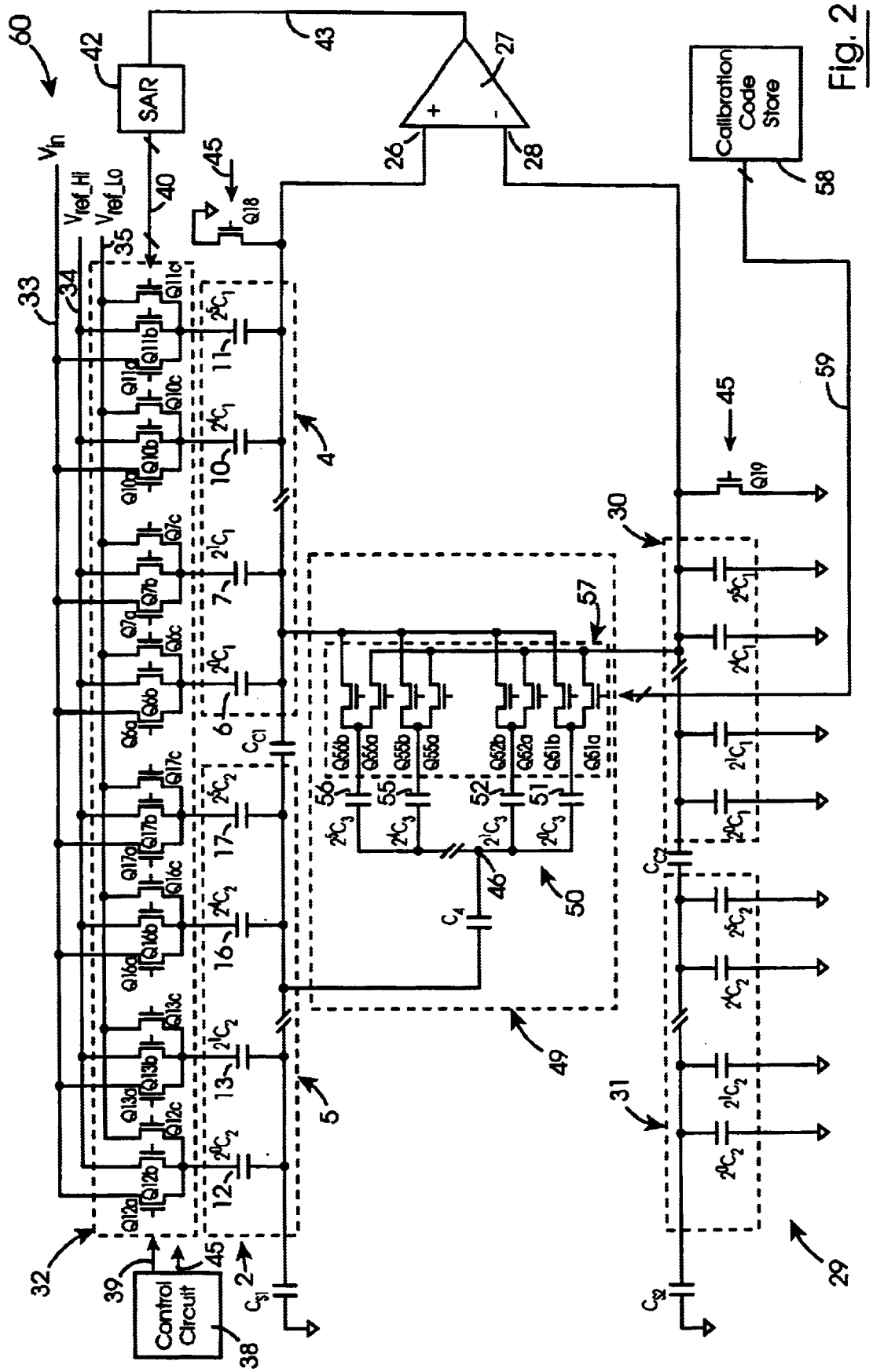
FIG. 2 is a circuit diagram of an ADC according to another embodiment of the invention.

Referring now to FIG. 2, there is illustrated an ADC according to another embodiment of the invention, indicated generally by the reference numeral 60. The ADC 60 is substantially similar to the ADC 1, and similar components are identified by the same reference numerals. The main difference between the ADC 60 and the ADC 1 is in the connection of the first calibration circuit 49. The first calibration circuit 49 of the ADC 60 is identical to that of the ADC 1 with the exception that the transistor switches Q51b to Q56b of the first calibration switch network 57 instead of selectively switching the corresponding first calibrating capacitors 51 to 56 to ground, selectively switch the corresponding first calibrating capacitors 51 to 56 to the first input 26 of the comparator 27. Thus, the first calibrating capacitors 51 to 56 are selectively switchable to one or other of the first and second inputs 26 and 28 of the comparator 27 for calibrating the coupling capacitor $C_{c1}$. The advantage of the ADC 60 over the ADC 1 is that the first calibration circuit 49 can correct for an over or under capacitance in coupling capacitor $C_{c1}$. If the coupling capacitor $C_{c1}$ is undersized, by switching appropriate ones of the first calibrating capacitors 51 to 56 to the first input 26 of the comparator 27 under capacitance of the coupling capacitor $C_{c1}$ is compensated for. By switching appropriate ones of the first calibrating capacitors 51 to 56 to the second input 28 of the comparator 27 over capacitance of the coupling capacitor $C_{c1}$ is compensated for.

The effect of the first calibration circuit 49 of the ADC 60 is as follows. When selected ones of the first calibrating capacitors 51 to 56 of the first calibration circuit 49 are switched to the first input 26 of the comparator 27, the capacitive coupling between the least significant capacitor array 5 and the most significant capacitor array 4 is increased. This has the same effect as increasing the capacitance of the coupling capacitor $C_{c1}$, and thus provides correction for under capacitance of the coupling capacitor $C_{c1}$. On the other hand, when selected ones of the first calibrating capacitors 51 to 56 of the first calibration circuit 49 are switched to the second input 28 of the comparator 27, the polarity of which is opposite to that of the first input 26, the effect is reversed. This, thus, has the same effect as decreasing the capacitance of the coupling capacitor $C_{c1}$, and thus compensates for over capacitance of the coupling capacitor $C_{c1}$. Thus, by providing the first calibration circuit 49 so that the first calibrating capacitors 51 to 56 can be selectively coupled to either the first or second inputs 26 or 28, respectively, of the comparator 27 facilitates compensation for both under and over capacitance of coupling capacitor $C_{c1}$.

Figure 3:
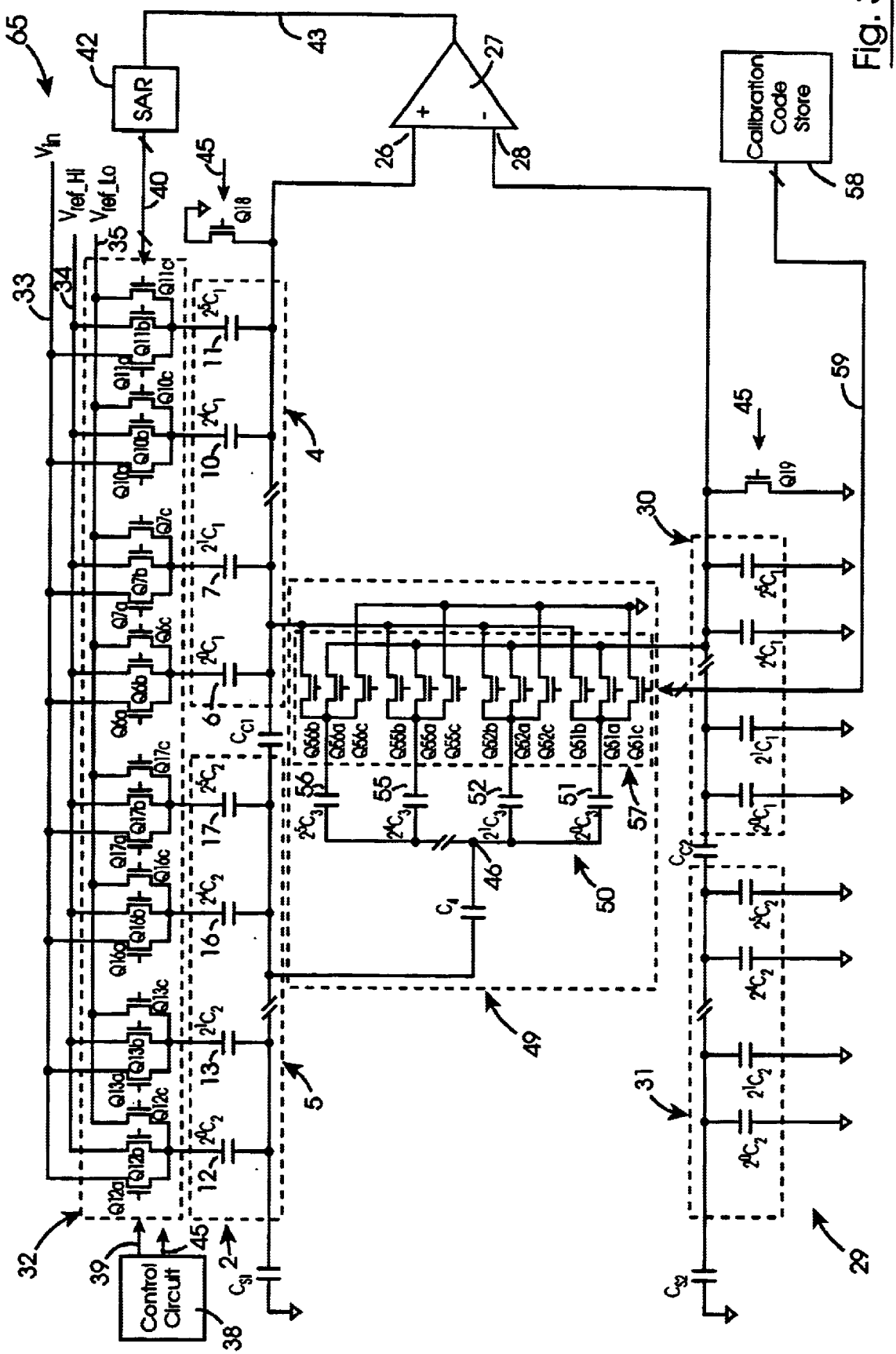
FIG. 3 is a circuit diagram of an ADC according to another embodiment of the invention.

Referring now to FIG. 3, there is illustrated an ADC also according to the invention, indicated generally by the reference numeral 65. The ADC 65 is substantially similar to the ADCs 1 and 60, and similar components are identified by the same reference numerals. The only difference between the ADC 65 and the ADCs 1 and 60 is that three transistor switches associated with each first calibration capacitor 51 to 56 are provided in the first calibration switch network 57 for selectively switching the first calibrating capacitors 51 to 56 to one of the first input 26 of the comparator 27, the second input 28 of the comparator 27, and ground. The transistor switches Q51a to Q56a are provided for selectively switching the first calibrating capacitors 51 to 56 to the second input 28 of the comparator 27. The transistor switches Q51b to Q56b are provided for selectively switching the first calibrating capacitors 51 to 56 to the first input 26 of the comparator 27. The transistor switches Q51c to Q56c are provided for selectively switching the first calibrating capacitors 51 to 56 to ground.

During calibration of the ADC 65 appropriate ones of the first calibrating capacitors 51 to 56 are switched to the second input 28 of the comparator 27 to compensate for any over-capacitance in the coupling capacitor $C_{c1}$. Appropriate ones of the first calibrating capacitors 51 to 56 are switched to the first input 26 of the comparator 27 as described with reference to the ADC 60 for compensating for under capacitance in the coupling capacitor $C_{c1}$. Those first calibrating capacitors 51 to 56 of the first calibration circuit 49 not required are switched to ground. A particularly important advantage of the ADC 65 is that for a given capacitor array 50, the resolution of the calibration is similar to that of the ADC 1 described with reference to FIG. 1, while the calibration range is doubled.

Figure 4:
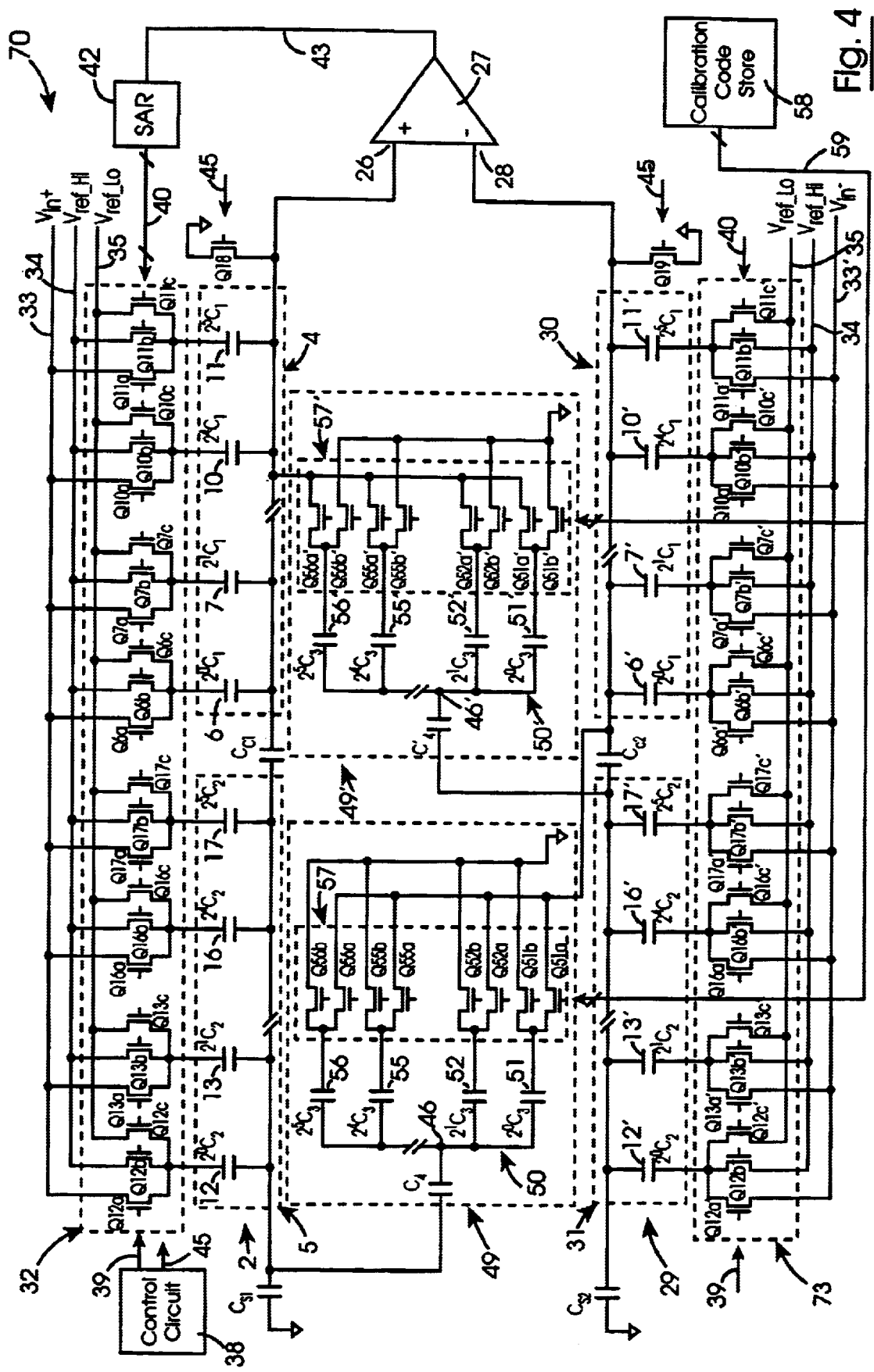
FIG. 4 is a circuit diagram of an ADC according to another embodiment of the invention.

Referring now to FIG. 4, there is illustrated an ADC also according to the invention, indicated generally by the reference numeral 70. The ADC 70 is a differential ADC for converting a sampled voltage of a differential analog voltage input signal to a digital word. The circuitry of the ADC 70 is substantially similar to that of the ADC 1, and similar components are identified by the same reference numerals. Being a differential ADC, the second capacitor circuit 29 forms the second leg of the differential ADC 70, while the first capacitor circuit 2 forms the first leg of the differential ADC 70. The second capacitor circuit 29 is identical to the first capacitor circuit 2, and the most significant capacitor array 30 of capacitors 6' to 11' and the least significant capacitor array 31 of capacitors 12' to 17' are of identical capacitance to that of the capacitors 6 to 17 of the most significant and least significant capacitor arrays 4 and 5, respectively, of the first capacitor circuit 2. Additionally, the most significant and least significant capacitor arrays 30 and 31 are coupled by a coupling capacitor $C_{c2}$ which is of similar capacitance to that of the coupling capacitor $C_{c1}$. The parasitic capacitance $C_{s2}$ of the least significant capacitor array 31 is substantially similar to the parasitic capacitance $C_{s1}$ of the least significant capacitor array 5. A second main switch network 73 selectively couples the capacitors 6' to 17' of the second capacitor circuit 29 to a second input line 33' and to the upper and lower voltage reference lines 34 and 35, respectively. The positive end of the differential analog voltage input signal is applied to the first input line 33, and the negative end of the differential analog voltage input signal is applied to the second input line 33'. The second main switch network 73 is identical to the first main switch network 32, and comprises transistor switches Q6a', Q6b' and Q6c' to Q17a', Q17b' and Q17c'. The transistor switches Q6a' to Q17a' are simultaneously operated with the transistor switches Q6a to Q17a under the control of the control circuit 38 by a control signal on the control line 39 for switching the capacitors 6' to 17' of the second capacitor circuit 29 to the second input line 33' for charging the respective capacitors 6' to 17' of the second capacitor circuit 29, while the capacitors 6 to 17 of the first capacitor circuit 2 are switched to the first input line 33, during sampling of the differential input voltage. The transistor switches Q6b' and Q6c' to Q17b' and Q17c' are operated under the control of the SAR 42 simultaneously as the corresponding transistor switches Q6b and Q6c to Q17b and Q17c are also being operated by the SAR 42 for determining the digital word corresponding to the sampled differential voltage of the differential input signal. The operation of such a differential ADC will be well known to those skilled in the art.

In this embodiment of the invention, as well as the first calibration circuit 49 for compensating for capacitance errors in the coupling capacitor $C_{c1}$, a second calibration circuit 49' which is identical to the first calibration circuit 49 is provided for compensating for capacitance errors in the coupling capacitor $C_{c2}$. The second calibration coupling capacitor C'$_4$ couples the second calibration circuit 49' to the least significant capacitor array 31, and the second calibration switch network 57' selectively couples the second calibrating capacitors 51' to 56' of the second calibration circuit 49' to the first input 26 of the comparator 27 or ground. In this embodiment of the invention the respective first and second calibration circuits 49 and 49' are identical to the first calibration circuit 49 of the ADC 1, and the operation of the respective first and second calibration circuits 49 and 49' is similar to that already described with reference to the first calibration circuit 49 of the ADC 1 of FIG. 1. The appropriate ones of the first calibrating capacitors 51 to 56 of the first calibration circuit 49 are switched by the transistor switches Q51a to Q56a to the second input 28 of the comparator 27 for compensating for over capacitance of the coupling capacitor $C_{c1}$, and those of the first calibrating capacitors 51 to 56 not required are switched to ground by the corresponding ones of the transistor switches Q51b to Q56b. Appropriate ones of the second calibrating capacitors 51' to 56' of the second calibration circuit 49' are switched to the first input 26 of the comparator 27 by the transistor switches Q51a' to Q56a' for compensating for over capacitance in the coupling capacitor $C_{c2}$. Those second calibrating capacitors 51' to 56' of the second calibration circuit 49' which are not required are switched by the transistor switches Q51b' to Q56b' to ground. However, in practice it is difficult to distinguish between capacitance errors in the coupling capacitors $C_{c1}$ and $C_{c2}$, and accordingly, calibration is carried out to minimize the combined effect of the capacitance errors in the coupling capacitors $C_{c1}$ and $C_{c2}$. This is carried out by switching appropriate calibrating capacitors 51 to 56 and 51' to 56' of the first and second calibrating circuits 49 and 49' to the second and first inputs 28 and 26, respectively, of the comparator 27 for simultaneously compensating for the capacitance errors in the two coupling capacitors $C_{c1}$ and $C_{c2}$. The calibration codes for appropriately switching the transistor switches Q51a and Q51b to Q56a and Q56b, and Q51a' and Q51b' to Q56a' and Q56b' are stored in the calibration code storing circuit 58. If desired, a second calibration code storing circuit may be provided for separately storing the calibration code for appropriately operating the transistor switches Q51a' and Q51b' to Q56a' and Q56b' of the second calibration circuit 49'.

Otherwise, calibration of the differential ADC 70 is similar to calibration of the ADC 1. Once calibrated the ADC 70 operates as a conventional differential ADC, and on power up the transistor switches Q51a and Q51b to Q56a and Q56b, and Q51a' and Q51b' to Q56a' to Q56b' of the first and second calibration circuits 49 and 49' are operated for switching the appropriate first calibrating capacitors 51 to 56 to the second input 28 of the comparator 27, and the appropriate second calibrating capacitors 51' to 56' to the first input 26 of the comparator 27, and the remaining ones of the first and second calibrating capacitors 51 to 56 and 51' to 56' not required, to ground, by the respective calibration codes.

Figure 5:
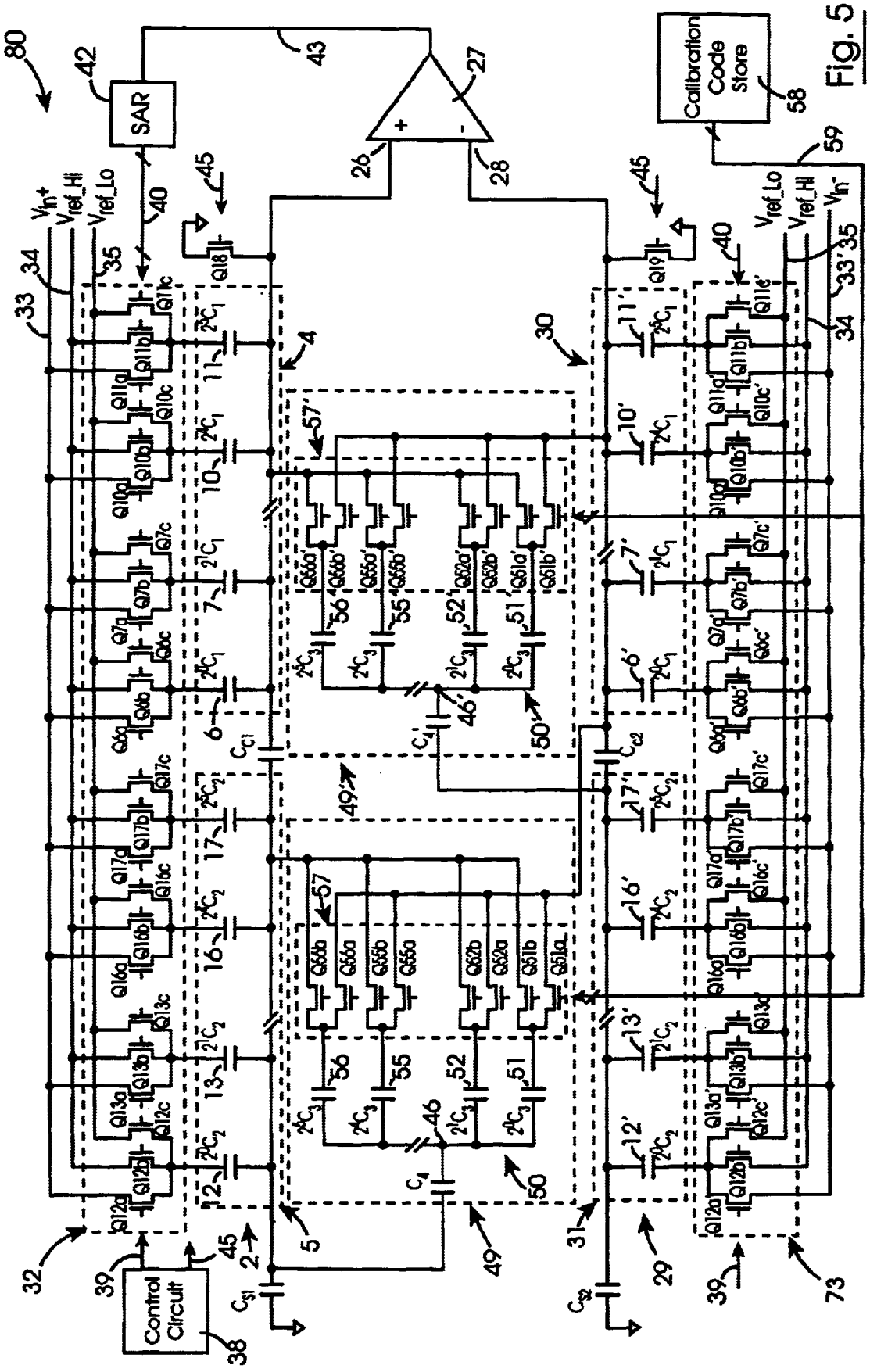
FIG. 5 is a circuit diagram of an ADC according to another embodiment of the invention.

Referring now to FIG. 5, there is illustrated a differential ADC also according to the invention, indicated generally by the reference numeral 80. The ADC 80 is substantially similar to the ADC 70 of FIG. 4 and the ADC 60 of FIG. 2, and similar components are identified by the same reference numerals. The main difference between the ADC 80 and the ADC 70 is in the respective first and second calibration circuits 49 and 49'. The first and second calibration circuits 49 and 49' of the ADC 80 are similar to the first calibration circuit 49 of the ADC 60 of FIG. 2. The operation of the first and second calibration circuits 49 and 49' of the differential ADC 80 for compensating for under and/or over capacitance of the coupling capacitor $C_{c1}$ and $C_{c2}$ of the first and second capacitor circuits 2 and 29 is similar to that described with reference to FIG. 4, but with the exception that the calibrating capacitors 51 to 56 and 51' to 56' are switched as described with reference to FIG. 2. Otherwise, calibration and operation of the differential ADC 80 is similar to that described with reference to the ADC 70 of FIG. 4.

Figure 6:
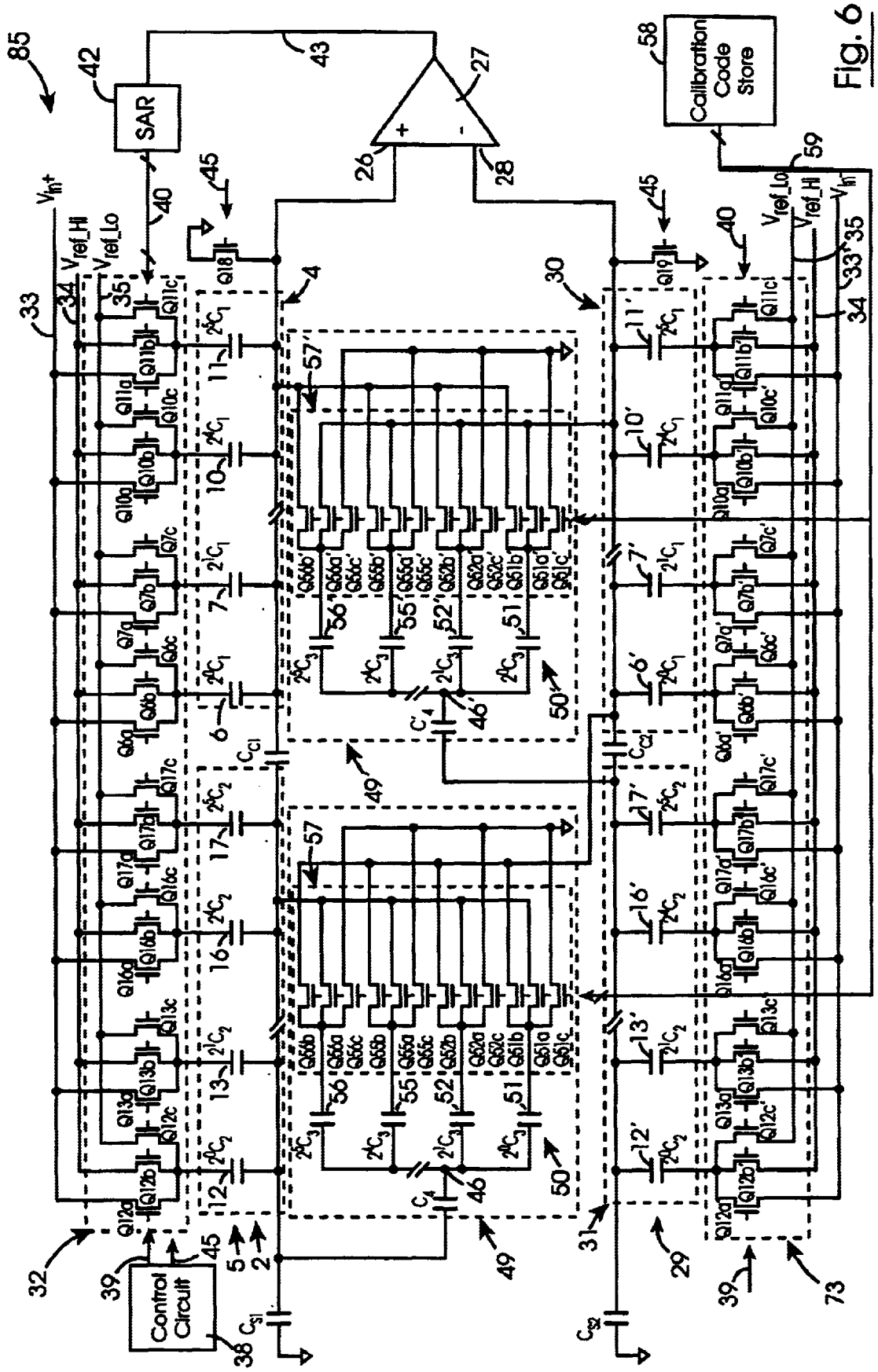
FIG. 6 is a circuit diagram of an ADC according to a further embodiment of the invention.

Referring now to FIG. 6, there is illustrated a differential ADC according to a further embodiment of the invention, indicated generally by the reference numeral 85. The differential ADC 85 is substantially similar to the differential ADC 70 of FIG. 4 and the ADC 65 of FIG. 3, and similar components are identified by the same reference numerals.

In this embodiment of the invention the first and second calibration circuits 49 and 49' are similar to the first calibration circuit 49 of the ADC 65 of FIG. 3, and thus calibration of the ADC 85 for compensating for under and/or over capacitance of the coupling capacitors $C_{c1}$ and $C_{c2}$ of the first and second capacitor circuits 2 and 29 is similar to that already described with reference to FIG. 4, but with the exception that the calibrating capacitors 51 to 56 and 51' to 56' are switched as described with reference to FIG. 3.

Figure 7:
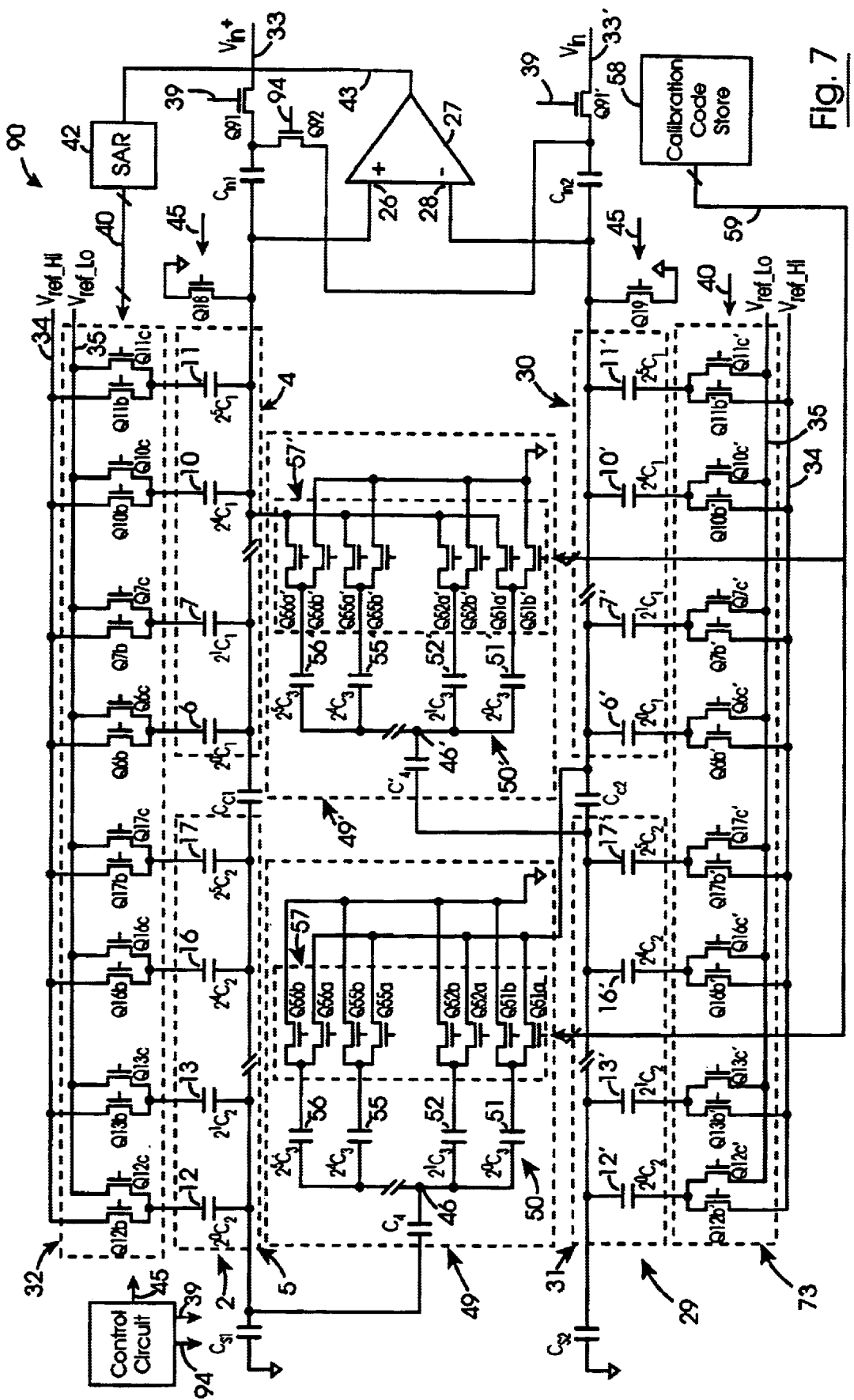
FIG. 7 is a circuit diagram of an ADC according to a still further embodiment of the invention.

Referring now to FIG. 7, there is illustrated a differential ADC also according to the invention, indicated generally by the reference numeral 90. The differential ADC 90 is substantially similar to the differential ADC 70, with the exception that in this embodiment of the invention the differential ADC 90 is tolerant of relatively large input common mode signals. In this embodiment of the invention the first and second input lines 33 and 33' are connected to respective input charge capacitors $C_{in1}$ and $C_{in2}$ through respective input transistor switches Q91 and Q91'. The respective input transistor switches Q91 and Q91' are simultaneously operated under the control of the control circuit 38 by a control signal on the control line 39 for charging of the respective input charge capacitors $C_{in1}$ and $C_{in2}$ during sampling of the differential voltage. The first and second charge control transistor switches Q18 and Q19 switch the respective first and second inputs 26 and 28 of the differential comparator 27 to ground during charging of the input charge capacitors $C_{in1}$ and $C_{in2}$ under the control of the control circuit 38 by the control signal on the control line 45. A third charge control transistor switch Q92 is operated under the control of the control circuit 38 by a control signal on a control line 94 so that the input plates of the input charge capacitors $C_{in1}$ and $C_{in2}$ are held at a common voltage after sampling of the differential voltage has been completed. Additionally, in this embodiment of the invention, since the differential voltage is sampled on the two input charge capacitors $C_{in1}$ and $C_{in2}$, the first and second main switch networks only comprise the transistor switches Q6b and Q6c to Q17b and Q17c, and Q6b' and Q6c' to Q17b' and Q17c', respectively.

The operation of differential ADC 90 will be well known to those skilled in the art. Calibration of the differential ADC 90 is similar to calibration of the differential ADC 70 using the respective first and second calibration circuits 49 and 49'.

It will be readily apparent to those skilled in the art that differential ADCs similar to the differential ADC 90 may be provided with respective first and second calibration circuits similar to the first and second calibration circuits of the differential ADCs 80 and 85. It is also envisaged that single ended ADCs of architecture similar to that of the ADC 90 of FIG. 7 may be provided with calibration circuits similar to those of the ADC described with reference to FIGS. 1 to 3.

Figure 8:
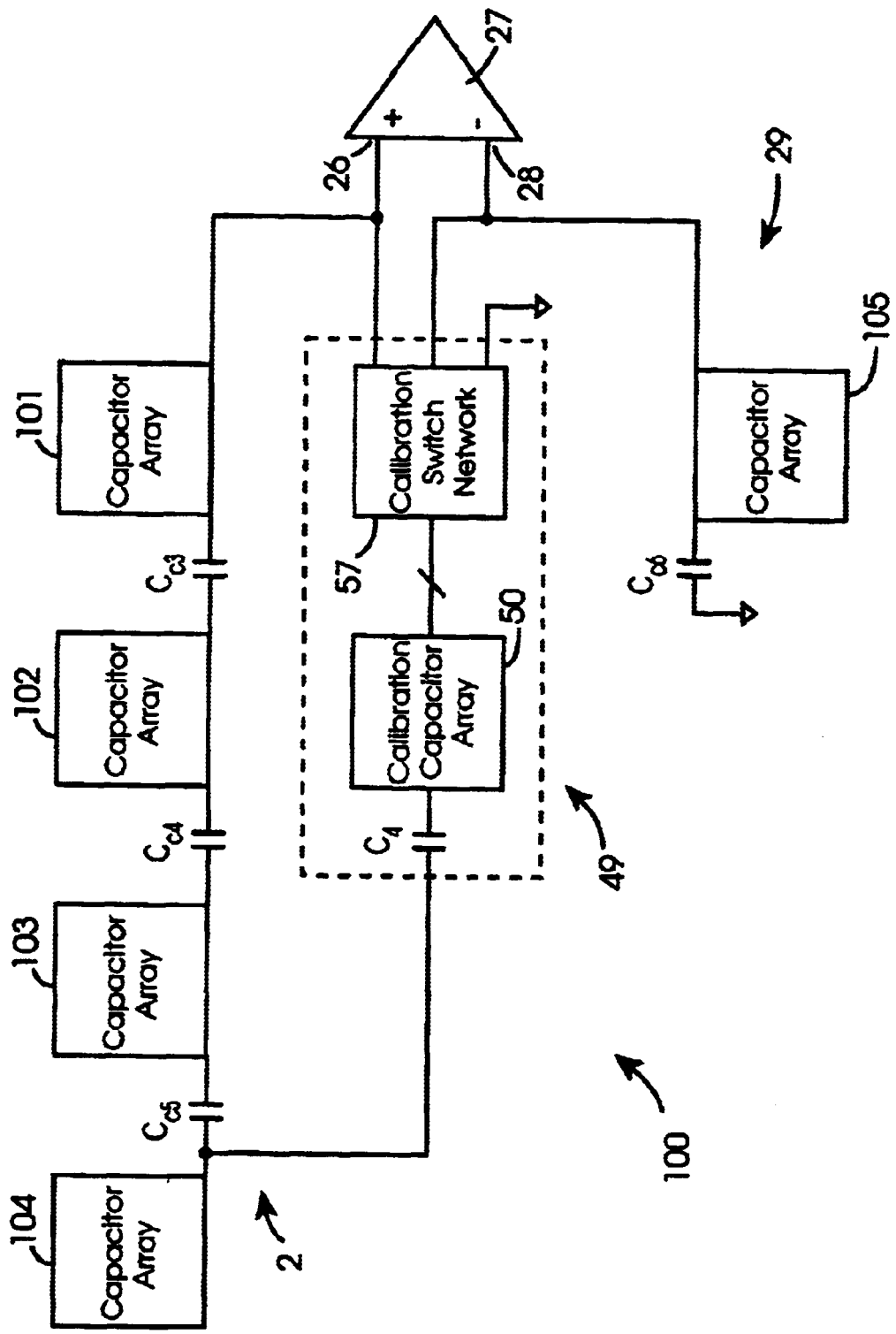
FIG. 8 is a block representation of an ADC also according to the invention.

Referring now to FIG. 8, there is illustrated a block representation of part of a single ended switched capacitor ADC of balanced architecture according to a further embodiment of the invention indicated generally by the reference numeral 100. The ADC 100 is substantially similar to the ADC 65 of FIG. 3 and similar components are identified by the same reference numerals. The main difference between the ADC 100 and the ADC 65 is in the first capacitor circuit 2 and the second capacitor circuit 29. The first capacitor circuit 2 comprises four series-coupled capacitor arrays 101, 102, 103 and 104 which are capacitively coupled by coupling capacitors $C_{c3}$, $C_{c4}$ and $C_{c5}$. The capacitor array 101 is the most significant capacitor array, and is connected to the first input 26 of the comparator 27. The capacitor array 104 is the least significant capacitor array, the capacitor array 103 being more significant than the capacitor array 104, and the capacitor array 102 being more significant than the capacitor array 103. The second capacitor circuit 29 comprises only one capacitor array 105 and one coupling capacitor $C_{c6}$ which couples the capacitor array 105 to ground. However, the combined capacitance of the capacitor array 105 and the coupling capacitor $C_{c6}$ is substantially similar to the combined capacitance of the first capacitor array 101 and the coupling capacitor $Cc_3$ of the first capacitor circuit 2, so that the capacitance on the first input 26 and the second input 28 of the comparator 27 are balanced.

In this embodiment of the invention the first calibration circuit 49, which is illustrated in block representation, is capacitively coupled by the first calibration coupling capacitor $C_4$ to the least significant capacitor array 104 for calibrating the coupling capacitor $C_{c5}$ between the least significant capacitor array 104 and the next more significant capacitor array, namely, the capacitor array 103. The array 50 of calibrating capacitors is similar to that of the ADC 65, and the first calibration switch network 57 comprises transistor switches similar to the switches Q51a, Q51b and Q51c to Q56a, Q56b and Q56c of the calibration switch network of the ADC 65. The first calibration switch network 57 selectively switches the calibrating capacitors of the calibrating capacitor array 50 to one of the first and second inputs 26 and 28 of the comparator 27 and to ground, for calibrating the coupling capacitor $C_{c5}$, in the same manner as the first calibration switch network 57 operates in the ADC 65.

Calibration of the coupling capacitor $C_{c5}$ is similar to that already described with reference to the ADC 65 of FIG. 3. Initially the calibrating capacitors of the calibrating capacitor array 50 are switched to ground, and are successively switched to one or other of the first and second inputs 26 and 28 of the comparator 27, depending on whether over or under capacitance is to be compensated for in the coupling capacitor $C_{c5}$. When calibration of the coupling capacitor $C_{c5}$ has been completed, those calibrating capacitors not switched to one or other of the first and second inputs 26 and 28 of the comparator 27 are switched to ground. The appropriate calibration code is then stored in the calibration code storing circuit (not shown).

The number of capacitors in each capacitor array 101 to 104 may be the same or different. Additionally, the unit capacitance of the capacitors in the capacitor arrays 101 to 104 may be the same or different. The values of the coupling capacitors $C_{c3}$ to $C_{c5}$ will be chosen depending on the unit capacitance values of the capacitors in the respective capacitor arrays 101 to 104.

While the ADC 100 has been described as being a single ended ADC, it will be readily apparent to those skilled in the art that the ADC 100 could be provided as a differential ADC, in which case, the second capacitor circuit 29 would be similar to the first capacitor circuit 2 and would comprise four series-coupled capacitor arrays similar to those of the first capacitor circuit 2. A single calibration circuit may be provided which would be similar to the first calibration circuit 49, and would be coupled in the same fashion as illustrated in the ADC 100, or alternatively two calibration circuits could be provided as described with reference to the ADCs of FIGS. 4 to 7.

Figure 9:
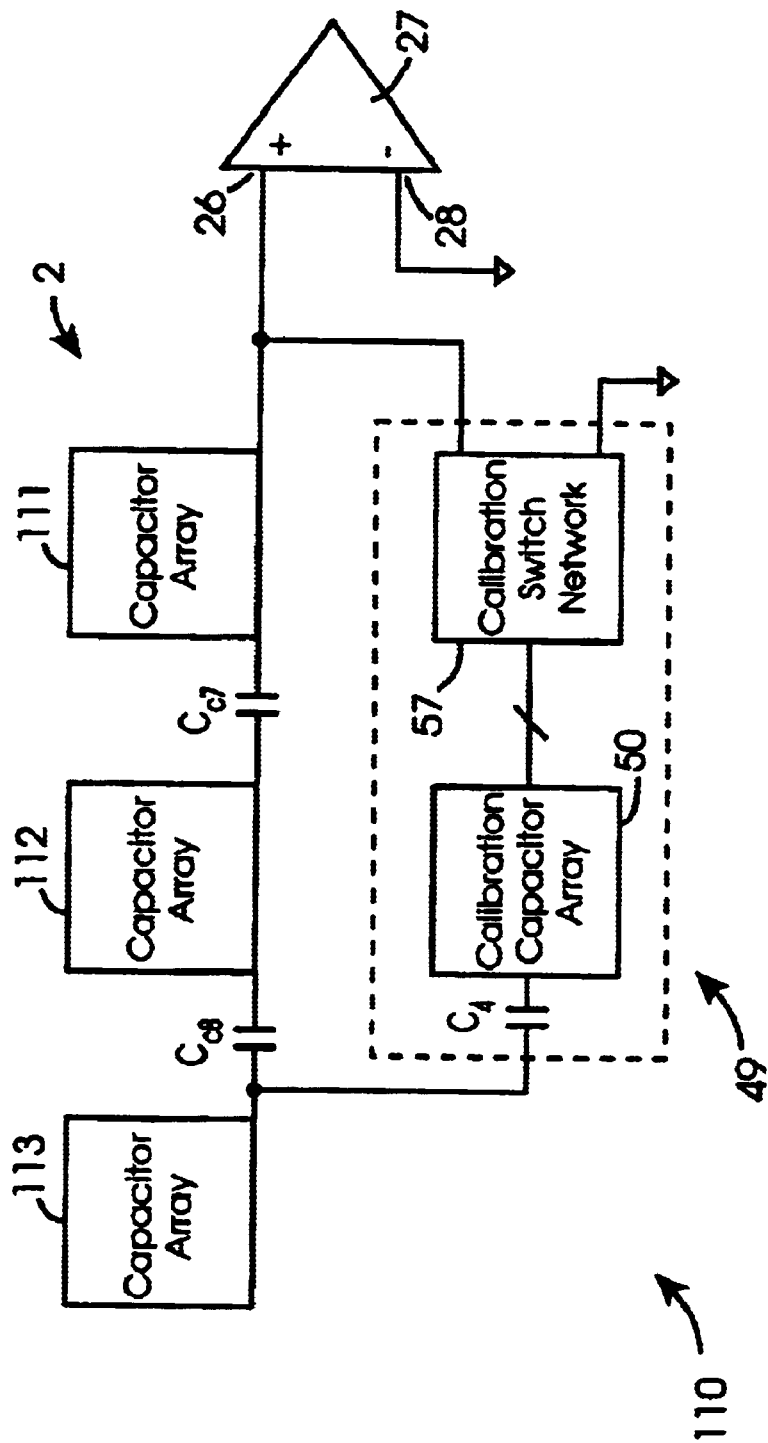
FIG. 9 is a block representation of an ADC also according to the invention.

Referring now to FIG. 9, there is illustrated a block representation of part of a single ended switched capacitor ADC also according to the invention, indicated generally by the reference numeral 110. The ADC 110 is somewhat similar to the ADC 1 and similar components are identified by the same reference numerals. The main difference between the ADC 110 and the ADC 1 is that the ADC 110 is not of balanced architecture, and in this case the second input 28 of the comparator 27 is coupled directly to the main voltage reference, namely, ground. The first capacitor circuit 2 comprises three series-coupled capacitor arrays, namely, a capacitor array 111, a capacitor array 112 and a capacitor array 113. The capacitor array 111 is the most significant capacitor array and is coupled to the first input 26 of the comparator 27. The capacitor array 113 is the least significant capacitor array. The capacitor array 112 which is less significant than the capacitor array 111 is capacitively coupled to the capacitor array 111by the coupling capacitor $C_{c7}$, while the least significant capacitor array 113 is capacitively coupled to its next more significant capacitor array 112 by the coupling capacitor $C_{c8}$. The first calibration circuit 49 is similar to the first calibration circuit 49 of the ADC 1 of FIG. 1, and in this embodiment of the invention is capacitively coupled by the calibration coupling capacitor $C_4$ to the least significant capacitor array 113. The first calibration switch network 57 comprises transistor switches which are similar to the switches Q51a and Q51b to Q56a and Q56b of the first calibration switch network 57 of the first calibration circuit 49 of the ADC 1. However, in this embodiment of the invention the first calibration switch network 57 selectively switches the calibrating capacitors of the calibrating capacitor array 50 to one or other of the first input 26 of the comparator 27 and ground. The first calibration circuit 49 thus facilitates compensation for capacitance errors in the coupling capacitor $C_{c8}$ which capacitively couples the least significant capacitor array 113 to its next more significant capacitor array 112.

The unit capacitance of the capacitors of the capacitor arrays 111, 112 and 113 may be the same or different, and the capacitance of the coupling capacitors $C_{c7}$ and $C_{c8}$ are selected depending on the unit capacitance of the capacitors of the capacitor arrays 111, 112 and 113.

Calibration of the coupling capacitor $C_{c8}$ is similar to calibration of the coupling capacitor $C_{c1}$ of the ADC 1. Initially the calibrating capacitors of the calibrating capacitor array 50 are switched by the first calibration switch network 57 to ground, and are successively switched by the first calibration switch network 57 from ground to the first input 26 of the comparator 27 until the capacitance errors in the coupling capacitor $C_{c8}$ have been adequately compensated for. The calibrating capacitors not switched to the first input 26 of the comparator 27 are switched to ground. The appropriate calibration code is then stored in the calibration code storing circuit (not shown).

While the ADC of FIG. 9 has been described as comprising three series-coupled capacitor arrays, with the first calibration circuit being connected to the least significant capacitor array, it will be readily apparent to those skilled in the art that the ADC of FIG. 9 could comprise four or more capacitively coupled capacitor arrays, and in which case, the first calibration circuit may be connected to any of the capacitor arrays, which are less significant than the second capacitor array. It is not necessary that the first calibration circuit be connected to the least significant capacitor array.

Figure 10:
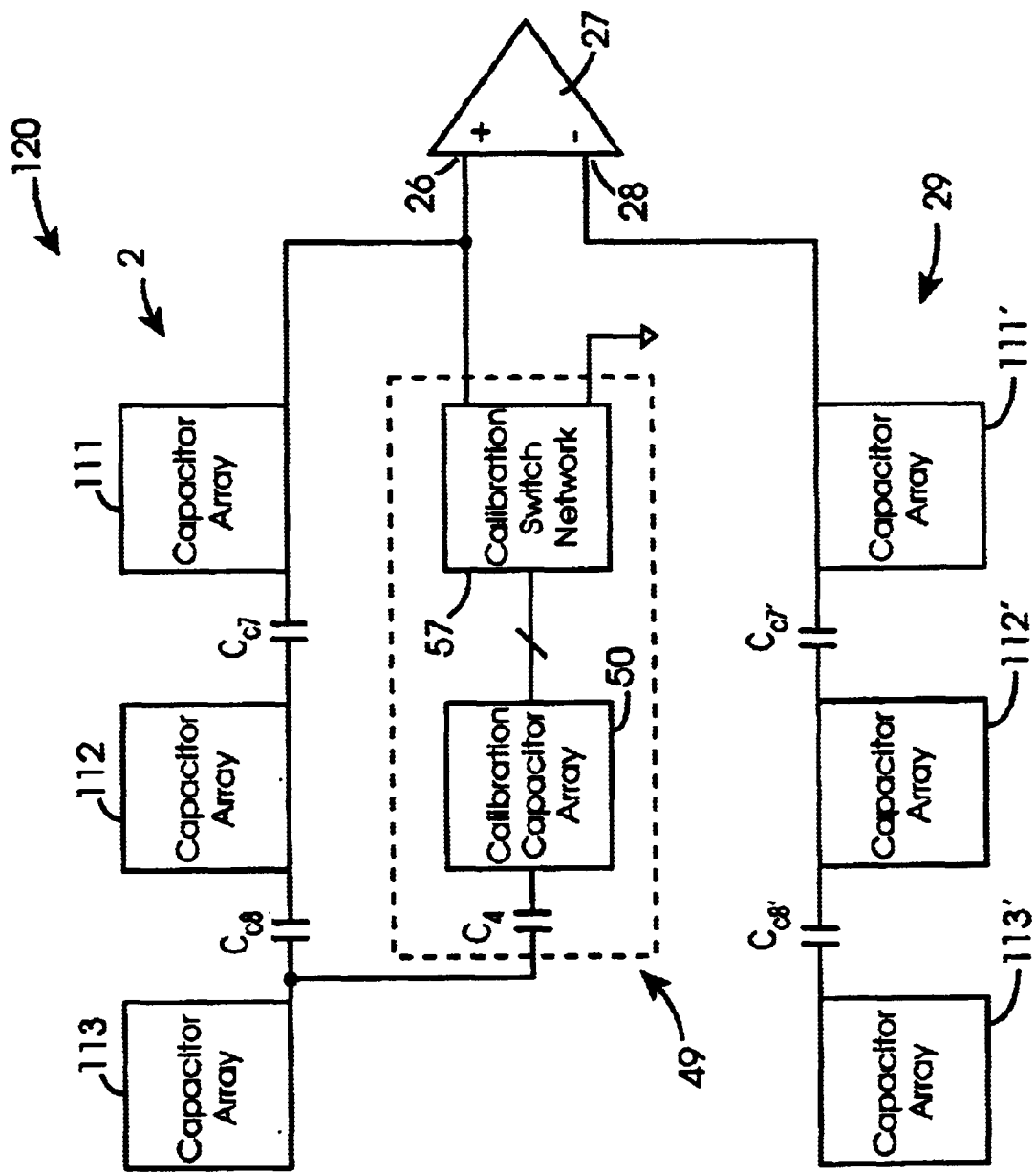
FIG. 10 is a block representation of an ADC according to another embodiment of the invention.

Referring now to FIG. 10, there is illustrated a block representation of a part of a differential switched capacitor ADC according to another embodiment of the invention, indicated generally by the reference numeral 120. The ADC 120 is somewhat similar to the ADC 110 of FIG. 9, with the exception that instead of being a single ended ADC of non-balanced architecture the ADC 120 is a differential ADC. Accordingly, the ADC 120 comprises a second capacitor circuit 29 comprising three series-coupled capacitor arrays 111', 112' and 113', which are similar to the capacitor arrays 111, 112 and 113 of the ADC of FIG. 9. The capacitor array 113', which is the least significant capacitor array, is capacitively coupled to the next more significant capacitor array 112' by a coupling capacitor $C_{c8}$, similar to the coupling capacitor $C_{c8}$ of the first capacitor circuit 2. The most significant capacitor array 111' is capacitively coupled to the capacitor array 112' by the coupling capacitor $C'_{c7}$, which is similar to the coupling capacitor $C_{c7}$ of the first capacitor circuit 2. The most significant capacitor array 111' is coupled to the second input 28, namely, the negative input of the comparator 27. The first calibration circuit 49 is coupled to the least significant capacitor array 113 of the first capacitor circuit 2 through the calibration coupling capacitor $C_4$, and the calibrating capacitors of the calibrating capacitor array 50 are selectively switchable by the first calibration switch network 57 to either ground or the first input 26, namely, the positive input of the comparator 27.

In this embodiment of the invention the first calibration circuit 49 is operable for calibrating both the coupling capacitor $C_{c8}$ of the first capacitor circuit 2 and the coupling capacitor $C'_{c8}$ of the second capacitor circuit 29. By selectively switching appropriate ones of the calibrating capacitors of the calibrating capacitor array 50 to the first input 26 of the comparator 27, capacitance errors in the two coupling capacitors $C_{c8}$ and $C'_{c8}$ are simultaneously compensated for. Calibrating capacitors of the calibrating capacitor array 50 not switched to the first input 28 of the comparator 27 are switched to ground.

Figure 11:
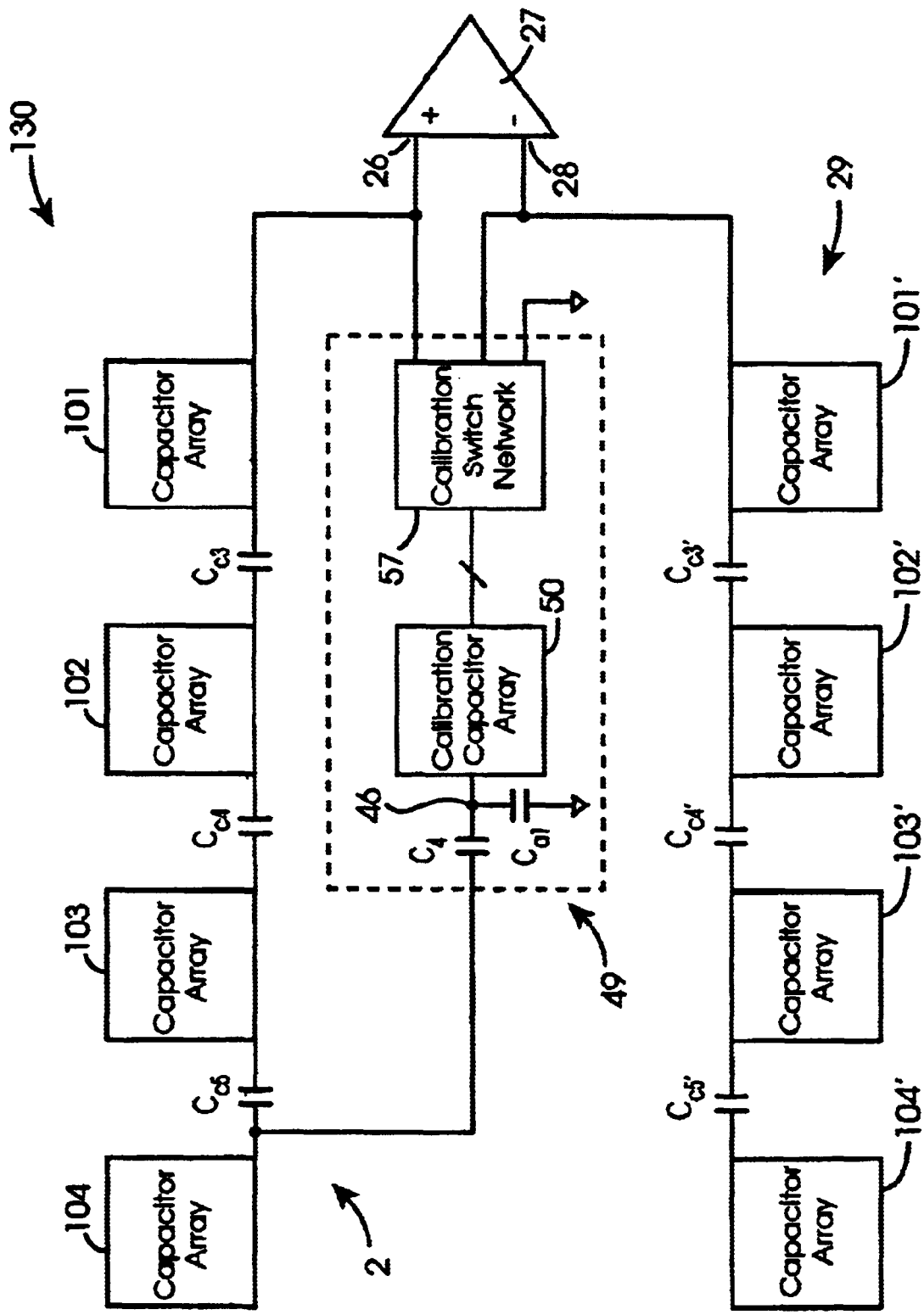
FIG. 11 is a block representation of an ADC according to a further embodiment of the invention.

Referring now to FIG. 11, there is illustrated a block representation of a part of a differential switched capacitor ADC according to another embodiment of the invention which is indicated generally by the reference numeral 130. The ADC 130 is somewhat similar to the ADC of FIG. 8, and similar components are identified by the same reference numerals. However, in this embodiment of the invention instead of being a single ended switched capacitor of balanced architecture as is the ADC of FIG. 8, as mentioned above the ADC 130 is a differential switched capacitor 130, and accordingly, the second capacitor circuit 29 comprises four series-coupled capacitor arrays 101', 102', 103' and 104' which are similar to the capacitor arrays 101, 102, 103 and 104 of the first capacitor circuit 2. The capacitor array 101', which is the most significant capacitor array in the second capacitor circuit 29 is coupled to the second input 28 of the comparator 27. The capacitor arrays 101', 102', 103' and 104' are capacitively coupled by coupling capacitors $C'_{c3}$, $C'_{c4}$ and $C'_{c5}$ which are similar to the coupling capacitors $C_{c3}$, $C_{c4}$ and $C_{c5}$.

Additionally, the first common node 46 to which the calibrating capacitors of the calibrating capacitor array 50 are coupled as well as being coupled to the least significant capacitor array 104 of the first capacitor circuit 2 by the first calibration coupling capacitor $C_4$, is also coupled to a voltage reference, which in this embodiment of the invention is ground through a first co-operating attenuating capacitor $C_{a1}$. The first co-operating attenuating capacitor $C_{a1}$ co-operates with the first calibration coupling capacitor $C_4$ for further attenuating the capacitance effect of the calibrating capacitors of the calibrating capacitor array 50. The first co-operating attenuating capacitor $C_{a1}$ co-operates with the first calibration coupling capacitor $C_4$ for effectively forming a potential divider type circuit between the voltage of the least significant capacitor array 104 of the first capacitor circuit 2 and ground. The provision of the first co-operating attenuating capacitor $C_{a1}$ permits the first calibration coupling capacitor $C_4$ to be of larger capacitance for a given attenuating effect of the capacitance of the calibrating capacitors of the calibrating capacitor array 50.

Otherwise, the use and calibration of the ADC 130 is similar to that already described with reference to FIG. 8, however, as well as compensating for capacitance errors in the coupling capacitor $C_{c5}$ of the first capacitor circuit 2, the first calibration circuit 49 simultaneously compensates for capacitance errors in the corresponding coupling capacitor $C'_{c5}$ of the second capacitor circuit 29.

While only the first calibration circuit of FIG. 11 has been described as comprising a first cooperating attenuating capacitor, it will be appreciated that any of the first calibration circuits may be provided with a first co-operating attenuating capacitor. Additionally, it is envisaged that the second calibration circuits may be provided with a co-operating attenuating capacitor, which for convenience would be referred to as a second co-operating attenuating capacitor.

While the ADC 100 of FIG. 8 has been described as comprising a first capacitor circuit comprising four series-coupled capacitor arrays, it will be readily apparent to those skilled in the art that the first capacitor circuit of the ADC of FIG. 8 may be provided with any number of capacitor arrays, and it will of course be appreciated that the calibration circuit may be connected to any of the capacitor arrays from the second most significant capacitor array downwardly to the least significant capacitor array. It is not necessary that the calibration circuit be coupled to the least significant capacitor array. The calibration circuit should be coupled to the capacitor array which is the less significant of two capacitively coupled capacitor arrays, the capacitive coupling of which is to be calibrated.

While the ADCs of FIGS. 1 to 7 have been described as being twelve bit ADCs, higher or lower resolution ADCs may be provided. It will also be appreciated that the ADCs may be provided with more than two series-coupled capacitor arrays in each first and second capacitor circuit. For example, it is envisaged that three or four or indeed more series-coupled capacitor arrays could be provided in each capacitor circuit, and each capacitor array would be capacitively coupled to its next more significant capacitor array. One or more first and/or second calibration circuits may be provided for calibrating one or more of the coupling capacitors for compensating for capacitive errors in the coupling capacitors. In each case the calibration circuit would be coupled to the less significant capacitor array of the two capacitively coupled capacitor arrays, the coupling capacitor of which is to be calibrated. The calibration switch network of each calibration circuit would selectively switch the calibrating capacitors to one or other of the first and second inputs of the comparator or ground. Similarly, while the capacitor arrays of the ADCs which have been described each comprise a similar number of capacitors, the number of capacitors in the respective capacitor arrays may be different from capacitor array to capacitor array in the same capacitor circuit. For example, the most significant capacitor array could include capacitors corresponding to a greater number of most significant bits than the number of capacitors corresponding to least significant bits in the least significant capacitor array. Needless to say, more than one first calibration circuit may be provided in the ADCs of FIGS. 8 to 11 should it be desired to compensate for capacitance errors in others of the coupling capacitors of the ADCs. In which case, a first calibration circuit would be provided for each of the coupling capacitors of the first capacitor circuit, the capacitance errors of which are to be compensated for. In the case of differential ADCs, capacitance errors in the corresponding coupling capacitors of the second capacitor circuit would be simultaneously compensated for by the corresponding first calibration circuits. Indeed, it will be readily apparent to those skilled in the art that in the case of the differential ADC of FIG. 10 the calibration circuit could be coupled to the corresponding capacitor array of the second capacitor circuit instead of to the capacitor array of the first capacitor circuit, however, in which case, the calibration switch network would be operated for switching the calibrating capacitors of the calibrating capacitor array to either the second input of the comparator or ground. It will also be appreciated that in the case of the ADC of FIG. 11 the calibration circuit may be coupled to the corresponding capacitor array of the second capacitor circuit, instead of to the capacitor array of the first capacitor circuit, and the net calibrating effect of the calibration circuit would be similar to that described with reference to FIG. 11.

While in the ADCs described with reference to FIGS. 1 to 3 the second capacitor circuits have been described as being identical to the first capacitor circuits, in certain cases, it is envisaged that the second capacitor circuit may be provided by a single balancing capacitor or a single capacitor array of capacitance substantially similar to the combined capacitance of the most significant capacitor array and the coupling capacitor coupling the most significant capacitor array to its next less significant capacitor array of the first capacitor circuit.

It will be appreciated that while the respective first and second calibration circuits have each been described as comprising six calibrating capacitors, it will be readily apparent to those skilled in the art that the calibration circuits may comprise any desired number of calibrating capacitors, and needless to say, the number of calibrating capacitors in each of the first and second calibration circuits bears no relationship to the number of capacitors in the respective capacitor arrays of the first and second capacitor circuits. The fact that in the ADC of FIG. 1 to 7 the calibration circuits comprise the same number of calibrating capacitors as the number of capacitors in the respective capacitor arrays of the first and second capacitor circuits is merely coincidental. Additionally, while the calibrating capacitors in the calibration circuit have been described as being binary weighted, while it is preferable that the calibrating capacitors be binary weighted, this is not essential, and an array of non-binary weighted calibrating capacitors could be provided, and in certain cases, it is envisaged that the calibrating capacitor array may comprise a combination of both binary weighted calibrating capacitors and non-binary weighted calibrating capacitors.

While in the ADCs of FIG. 1 to 7 the unit capacitance of the capacitors of the capacitor arrays have been described as being similar, it will be readily apparent to those skilled in the art that the unit capacitance of the capacitors of the respective capacitor arrays may be the same or different.

While the calibration switch network of each calibration circuit has been described for selectively switching the calibration capacitors to ground, the calibrating capacitors not required to be switched to the first or second inputs of the comparator may be switched to any voltage reference, and the voltage reference to which the calibrating capacitors may be switched may be the same or different for each calibrating capacitor.

Additionally, in the ADCs of FIGS. 1 to 3, the capacitors of the capacitor arrays of the second capacitor circuit may be coupled to any voltage reference besides ground, and it will be appreciated that the capacitors of the capacitor arrays of the second capacitor circuit may be coupled to different voltage references. Additionally, it will be appreciated that the coupling capacitor of the ADC of FIG. 8 which couples the capacitor array of the second capacitor circuit to ground may couple the capacitor array to any suitable voltage reference.

While the capacitor arrays of the first and second capacitor circuits, which are switched by the SAR have been described as being binary weighted, it will be appreciated by those skilled in the art that some of the capacitor arrays of the first and second capacitor circuits may be non-binary weighted. Where such non-binary weighted capacitor arrays are provided, additional logic circuits will be required to generate the conversion results from the SAR result. Such logic circuits will be well known to those skilled in the art.

What is claimed is:

1. An analog to digital converter (ADC) comprising:
   a first capacitor circuit from which a digital output word is derived corresponding to a sampled analog voltage from an input signal, the first capacitor circuit comprising at least two capacitor arrays of progressively increasing significance, each capacitor array being capacitively coupled to the next more significant capacitor array,
   a second capacitor circuit,
   a comparator having a first input coupled to the most significant capacitor array, and a second input coupled to the second capacitor circuit, and
   a first calibration circuit comprising an array of first calibrating capacitors, coupled to one of the capacitor arrays of the first capacitor circuit which is less significant than the most significant capacitor array, the first calibrating capacitors being selectively coupleable to the second input of the comparator for compensating for capacitance errors in the capacitive coupling between the capacitor array to which the first calibration circuit is coupled and the next more significant capacitor array.

2. An ADC as claimed in claim 1 in which the first calibrating capacitors of the first calibration circuit are selectively coupleable to the first input of the comparator for compensating for capacitance errors in the capacitive coupling between the capacitor array to which the first calibration circuit is coupled and the next more significant array.

3. An ADC as claimed in claim 1 in which the first calibrating capacitors of the first calibration circuit are selectively coupleable to a first voltage reference.

4. An ADC as claimed in claim 1 in which each of the first calibrating capacitors of the first calibration circuit are selectively coupleable to one of the second input of the comparator, the first input of the comparator, and the first voltage reference.

5. An ADC as claimed in claim 4 in which the first calibration circuit is coupled to the second most significant capacitor array of the first capacitor circuit.

6. An ADC as claimed in claim 4 in which the capacitor array of the first capacitor circuit to which the first calibration circuit is coupled is less significant than the second most significant capacitor array.

7. An ADC as claimed in claim 1 in which a first calibrating switch network is provided between the first calibrating capacitors of the first calibration circuit and the second input of the comparator for selectively coupling the first calibrating capacitors to the second input of the comparator.

8. An ADC as claimed in claim 7 in which the first calibrating switch network is provided for selectively coupling the first calibrating capacitors of the first calibration circuit to the first input of the comparator.

9. An ADC as claimed in claim 7 in which the first calibrating switch network is provided for selectively coupling the first calibrating capacitors of the first calibration circuit to the first voltage reference.

10. An ADC as claimed in claim 1 in which the first calibrating capacitors of the first calibration circuit are coupled through a first common node to the capacitor array of the first capacitor circuit.

11. An ADC as claimed in claim 10 in which the first common node to which first calibrating capacitors of the first calibration circuit are coupled is capacitively coupled to the capacitor array of the first calibration capacitor circuit by a first coupling capacitor for attenuating the capacitance value effect of the first calibrating capacitors.

12. An ADC as claimed in claim 11 in which the first common node to which the first calibrating capacitors are coupled is coupled to a voltage reference by a first co-operating attenuating capacitor for co-operating with the first calibration coupling capacitor for attenuating the capacitance value effect of the first calibrating capacitors.

13. An ADC as claimed in claim 1 in which the first calibrating capacitors of the first calibration circuit are binary weighted relative to each other.

14. An ADC as claimed in claim 1 in which the capacitors of the capacitor arrays of the first capacitor circuit are selectively switchable for determining the digital word corresponding to the sampled voltage of the input signal.

15. An ADC as claimed in claim 1 in which the second capacitor circuit capacitively couples the second input of the comparator to a main voltage reference.

16. An ADC as claimed in claim 1 in which the second capacitor circuit comprises respective capacitor arrays corresponding to the capacitor arrays in the first capacitor circuit, each capacitor array of the second capacitor circuit being capacitively coupled to the next more significant capacitor array, and the most significant capacitor array of the second capacitor circuit being coupled to the second input of the comparator.

17. An ADC as claimed in claim 16 in which the capacitor arrays of the second capacitor circuit are coupled to the main voltage reference.

18. An ADC as claimed in claim 16 in which the ADC is adapted for receiving a differential signal, the capacitors of the capacitor arrays of the respective first and second capacitor circuits being selectively switchable for determining a digital word corresponding to a sampled differential voltage of the differential signal.

19. An ADC as claimed in claim 18 in which the first calibration circuit compensates for capacitance errors in the capacitive coupling in the second capacitor circuit between the two capacitor arrays in the second capacitor circuit, the less significant of which corresponds to the less significant capacitor array of the first capacitor circuit to which the first calibration circuit is coupled.

20. An ADC as claimed in claim 18 in which a second calibration circuit is provided comprising an array of second calibrating capacitors coupled to one of the capacitor arrays of the second capacitor circuit which is less significant than the most significant capacitor array of the second capacitor circuit, the second calibrating capacitors being selectively coupleable to the first input of the comparator.

21. An ADC as claimed in claim 20 in which the second calibrating capacitors of the second calibration circuit are selectively coupleable to the first input of the comparator.

22. An ADC as claimed in claim 20 in which the second calibrating capacitors of the second calibration circuit are selectively coupleable to a second voltage reference.

23. An ADC as claimed in claim 20 in which the second calibrating capacitors of the second calibration circuit are selectively coupleable to one of the first input of the comparator, the second input of the comparator, and the second voltage reference.

24. An ADC as claimed in claim 20 in which the second calibration circuit is coupled to the second most significant capacitor array of the second capacitor circuit.

25. An ADC as claimed in claim 20 in which the capacitor array of the second capacitor circuit to which the second calibration circuit is coupled is less significant than the second most significant capacitor array.

26. An ADC as claimed in claim 20 in which a second calibrating switch network is provided between the second calibrating capacitors of the second calibration circuit and the first input of the comparator for selectively coupling the second calibrating capacitors of the second calibration circuit to the first input of the comparator.

27. An ADC as claimed in claim 26 in which the second calibrating switch network is provided for selectively coupling the second calibrating capacitors of the second calibration circuit to the second input of the comparator.

28. An ADC as claimed in claim 26 in which the second calibrating switch network is provided for selectively coupling the second calibrating capacitors of the second calibration circuit to the second voltage reference.

29. An ADC as claimed in claim 20 in which the second calibrating capacitors of the second calibration circuit are coupled through a second common node to the capacitor array of the second capacitor circuit.

30. An ADC as claimed in claim 20 in which the second common node to which the array of second calibrating capacitors of the second calibration circuit is coupled is capacitively coupled to the capacitor array of the second capacitor circuit by a second calibration coupling capacitor for attenuating the capacitive value of the second calibrating capacitors.

31. An ADC as claimed in claim 30 in which the second common node to which the second calibrating capacitors are coupled is coupled to a voltage reference by a second co-operating attenuating capacitor for co-operating with the second calibration coupling capacitor for attenuating the capacitance value effect of the second calibrating capacitors.

32. An ADC as claimed in claim 20 in which the second calibrating capacitors of the second calibration circuit are binary weighted relative to each other.

33. An ADC as claimed in claim 1 in which a first main switch network is provided for selectively and alternately switching the capacitors of the capacitor arrays of the first capacitor circuit to an upper voltage reference and a lower voltage reference for charging thereof.

34. An ADC as claimed in claim 33 in which the first main switch network is provided for selectively switching the capacitors of the capacitor arrays of the first capacitor circuit to the input signal, the voltage of which is to be sampled.

35. An ADC as claimed in claim 33 in which a first charge control switch is coupled to the first input of the comparator for selectively coupling the first input of the comparator to the main voltage reference during sampling of the voltage of the input signal.

36. An ADC as claimed in claim 35 in which a second charge control switch is coupled to the second input of the comparator for selectively coupling the second input of the comparator to the main voltage reference during sampling of the voltage of the input signal.

37. An ADC as claimed in claim 33 in which a second main switch network is provided for selectively and alternately switching the capacitors of the capacitor arrays of the second capacitor circuit to the upper voltage reference and the lower voltage reference for configuring the ADC as a differential ADC.

38. An ADC as claimed in claim 37 in which the second main switch network is provided for selectively switching the capacitors of the capacitor arrays of the second capacitor circuit to one end of a differential input signal, the voltage of which is to be sampled, the capacitors of the capacitor arrays of the first capacitor circuit being selectively switched to the other end of the differential input signal by the first main switch network.

39. An ADC as claimed in claim 37 in which a first input charge capacitor is connected to the first input of the comparator, and the first input charge capacitor is selectively switchable to the input signal, the voltage of which is to be sampled for charging the first input charge capacitor, and the main voltage reference when the first input charge capacitor has been charged.

40. An ADC as claimed in claim 39 in which a second input charge capacitor is connected to the second input of the comparator, and the second input charge capacitor is selectively switchable to one end of a differential input signal, the voltage of which is to be sampled for charging the second input charge capacitor, and the first input charge capacitor when the first and second input charge capacitors have been charged, the first input charge capacitor being selectively switchable to the other end of the differential input signal.

41. An analog to digital converter (ADC) comprising:
a first capacitor circuit from which a digital output word is derived corresponding to a sampled analog voltage from an input signal, the first capacitor circuit comprising at least three capacitor arrays of progressively increasing significance, each capacitor array being capacitively coupled to the next more significant capacitor array,
a comparator having a first input coupled to the most significant capacitor array, and a second input coupled to a voltage reference, and
a first calibration circuit comprising an array of first calibrating capacitors, coupled to one of the capacitor arrays of the first capacitor circuit which is less significant than the second most significant capacitor array, the first calibrating capacitors being selectively coupleable to the first input of the comparator for compensating for capacitance errors in the capacitive coupling between the capacitor array to which the first calibration circuit is coupled and the next more significant capacitor array.

42. An ADC as claimed in claim 41 in which the first calibrating capacitors of the first calibration circuit are selectively coupleable to a voltage reference which may be the same or different to the voltage reference to which the second input of the comparator is coupled.

43. A method for compensating for capacitance errors in capacitive coupling in an ADC of the type comprising a first capacitor circuit from which a digital output word is derived corresponding to a sampled analog voltage from an input signal, the first capacitor circuit comprising at least two capacitor arrays of progressively increasing significance, each capacitor array being capacitively coupled to the next more significant capacitor array, and a comparator having a first input coupled to the most significant capacitor array and a second input coupled to a second capacitor circuit, the method comprising the steps of coupling a first calibration circuit comprising an array of first calibrating capacitors to one of the capacitor arrays of the first capacitor circuit which is less significant than the most significant capacitor array, and selectively coupling the first calibrating capacitors to the second input of the comparator for compensating for the capacitance errors in the capacitive coupling between the capacitor array to which the first calibration circuit is connected and the next more significant capacitor array until the capacitance errors in the capacitive coupling have been compensated for.

44. A method as claimed in claim 43 in which the first calibrating capacitors of the first calibration circuit which are not coupled to the second input of the comparator are coupled to a first voltage reference.

45. A method as claimed in claim 43 in which the first calibrating capacitors are selectively coupled to one of the second input of the comparator and the first input of the comparator for compensating for capacitance errors in the capacitive coupling between the capacitor array to which the first calibration circuit is coupled and the next more significant capacitor array until the capacitance errors in the capacitive coupling have been compensated for, and the first calibrating capacitors which are not coupled to one of the first input and the second input of the comparator are coupled to the first voltage reference.

* * * * *